United States Patent [19]

Morosawa et al.

[11] Patent Number: 5,694,061
[45] Date of Patent: Dec. 2, 1997

[54] SEMICONDUCTOR DEVICE HAVING SAME CONDUCTIVE TYPE MIS TRANSISTORS, A SIMPLE CIRCUIT DESIGN, AND A HIGH PRODUCTIVITY

[75] Inventors: Katsuhiko Morosawa, Fussa; Haruo Wakai, Mizuhomachi, both of Japan

[73] Assignee: Casio Computer Co., Ltd., Tokyo, Japan

[21] Appl. No.: 621,112

[22] Filed: Mar. 22, 1996

[30] Foreign Application Priority Data

Mar. 27, 1995 [JP] Japan .................................. 7-094504
Jul. 3, 1995 [JP] Japan .................................. 7-191310

[51] Int. Cl.$^6$ .................................................. H03K 4/58
[52] U.S. Cl. ................................... 326/119; 326/88
[58] Field of Search ........................... 326/83, 88, 119; 327/390

[56] References Cited

U.S. PATENT DOCUMENTS

| | | | |
|---|---|---|---|
| 4,562,365 | 12/1985 | Redfield ................................. | 326/88 X |
| 4,649,300 | 3/1987 | Schutz .................................. | 326/88 |
| 4,725,746 | 2/1988 | Segawa et al. ........................ | 326/88 |
| 4,914,323 | 4/1990 | Shibata et al. ........................ | 326/88 X |
| 5,327,026 | 7/1994 | Hardee et al. ......................... | 326/88 |

*Primary Examiner*—David R. Hudspeth
*Attorney, Agent, or Firm*—Frishauf, Holtz, Goodman, Langer & Chick

[57] ABSTRACT

A semiconductor device having at least first and second MIS transistors of a same P or N conductive type. The first MIS transistor has a first data terminal which receives a high potential Vdd, and the second MIS transistor has a first data terminal which receives a low potential GND lower than the high potential Vdd. An output terminal is coupled to second data terminals of the first and second MIS transistors. A first input terminal is connected to a gate of the first MIS transistor for supplying a non-inverted signal. A second input terminal is directly connected to a gate of one of the first and second MIS transistors for supplying an inverted signal having a reverse polarity to the non-inverted signal and which is synchronized with the non-inverted signal. An output voltage compensating circuit is connected between one of (i) the output terminal and the first input terminal and (ii) the output terminal and the second input terminal. The output voltage compensating circuit prevents the lower potential of an output signal from rising if the semiconductor device includes PMIS transistors, and prevents the higher potential of the output signal from falling if the semiconductor device includes NMIS transistors.

40 Claims, 33 Drawing Sheets

| Ia | Ī a | Ib | Ī b | EXOR | EXNOR |
|----|-----|----|-----|------|-------|
| 0  | 1   | 0  | 1   | 0    | 1     |
| 0  | 1   | 1  | 0   | 1    | 0     |
| 1  | 0   | 0  | 1   | 1    | 0     |
| 1  | 0   | 1  | 0   | 0    | 1     |

TO DRAIN LINE

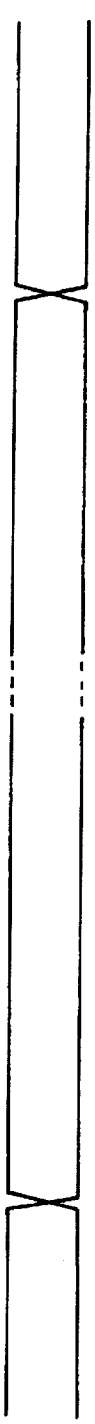
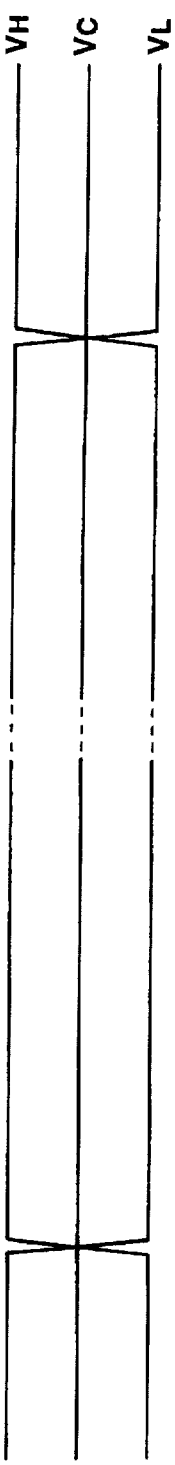
FIG.39A XSCL
FIG.39B XD
FIG.39C OP
FIG.39D Data
FIG.39E WF
FIG.39F Dn
n = 1, 2, 3···

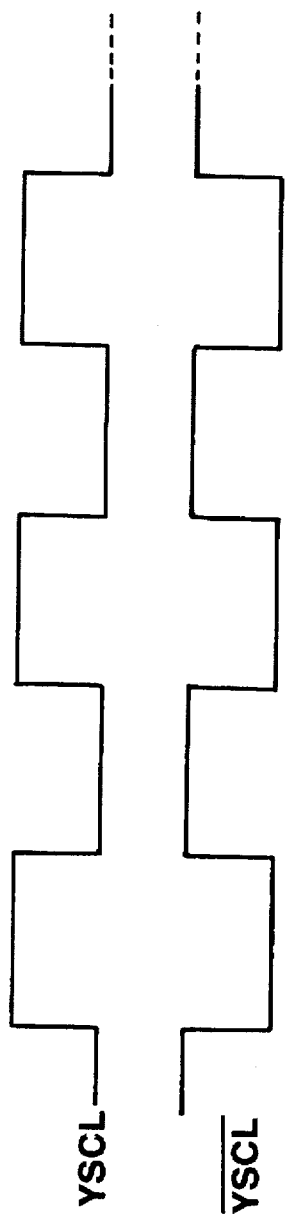
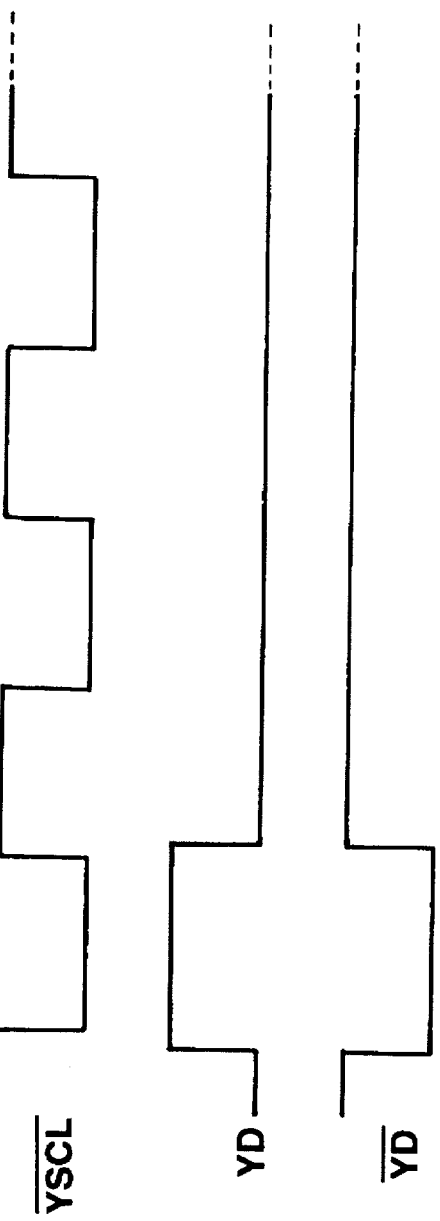
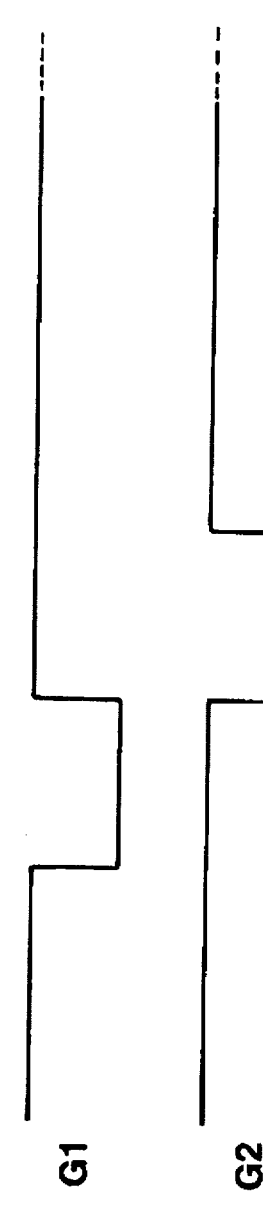
FIG.41A FIG.41B FIG.41C FIG.41D FIG.41E FIG.41F

SEMICONDUCTOR DEVICE HAVING SAME CONDUCTIVE TYPE MIS TRANSISTORS, A SIMPLE CIRCUIT DESIGN, AND A HIGH PRODUCTIVITY

BACKGROUND OF THE INVENTION

1. Field of the Invention

The present invention relates to a semiconductor device and a display drive using the semiconductor device. More specifically, the present invention relates to a semiconductor device including same conductive type of metal-insulator semiconductor (MIS) transistors and a display drive using the device.

2. Description of the Related Art

Heretofore, if a driver circuit of in a liquid crystal display and others is constituted by a thin film transistor (TFT), a complementary MIS (CMIS) circuit is normally used. This CMIS circuit is widely used because it has advantages such as low power consumption and appropriate output can be obtained.

FIG. 44 shows the conventional constitution of a CMIS inverter circuit. As shown in FIG. 44, a CMIS circuit 1 is constituted by a pair of a P-channel MIS (PMIS) transistor 2 and an N-channel MIS (NMIS) transistor 3. When a signal is at the level of "0" at an input terminal IN, the PMIS 2 is mined on, supply voltage Vdd is applied to an output terminal OUT and a signal at the level of "1" is output from the output terminal OUT. When a signal is at the level of "1" at the input terminal IN, the NMIS 3 is mined on, voltage at the level of ground VGND is applied to the output terminal OUT and a signal at the level of "0" is output from the output terminal OUT. As described above, the CMIS inverter circuit outputs a signal whose level at the input terminal is inverted at the output terminal.

An inverter circuit may be also constituted by only either of the PMIS or NMIS transistor. This type of inverter circuit comprises a ratio type and a non-ratio type and further, the ratio type inverter circuit comprises a resistor loaded type, an enhancement/enhancement (E/E) type and an enhancement/depression (E/D) type.

In the above description, an inverter circuit is given as an example, however, a CMOS circuit can be also used for constituting a latch circuit, a tristate logic circuit, a drain driver circuit and a gate driver circuit, or for constituting an OR circuit, an EXCLUSIVE-OR circuit, an AND circuit and a NAND circuit as a logic circuit.

A CMIS circuit comprises two types of transistors, that is, PMIS and NMIS transistors. Therefore, a large number of steps for doping impurities and a large number of steps for arranging photomasks are required. Therefore, there is a problem that the manufacturing process and the structure of the elements are complicated and that the completed device costs a lot.

When a Lightly Doped Drain (LDD) structure, in which areas different from each other in the density of impurities are formed, is adopted as the structure of a semiconductor device so as to prevent current from leaking from a channel of the semiconductor device, the number of processes in which impurities are doped is further increased.

Therefore, it is desirable to adopt a structure in which only either PMIS or NMIS transistor is used without using a CMIS circuit as described above. Of this type of inverter circuits, for example the above-described resistor loaded type includes a switching transistor and a loading resistor. This type of inverter circuit uses either PMIS or NMOS transistor, resulting in a simple structure and a small number of manufacturing steps. However, this resistor loaded type has a problem that large scale integration is disabled, direct leak current is high and the signal range of the output signal is small because a loading resistor requiring large area is required.

Further, FIG. 45 shows an example of the conventional constitution of a non-ratio type inverter circuit 4. As this non-ratio type inverter circuit 4 is constituted by the same conductive type of two PMIS transistors 5 and 6, the number of steps for doping impurities is smaller than that of a CMIS circuit. For the non-ratio type inverter circuit, a large scale integration is also enabled because the circuit uses no loading resistor.

When a signal at the level of "0" is input to the gate of the PMIS transistor 5 in this non-ratio type inverter circuit 4, the PMIS transistor 5 is turned on. Therefore, supply voltage Vdd is applied to the output terminal OUT and a signal at the level of "1" is output from the output terminal OUT. At this time a signal at the level of "1" is input to the gate of the PMIS transistor 6, the PMIS transistor 6 is turned off and no current from the power supply flows to the ground.

On the contrary, when a signal at the level of "1" is input to the gate of the PMIS transistor 5, the PMIS transistor 5 is turned off. A signal at the level of "0" is input to the gate of the PMIS transistor 6 and the PMIS transistor 6 is turned on. Therefore, a signal at the level of "0" being ground potential VGND should be output from the output terminal OUT. However, the voltage of an output signal at the level of "0" is higher by the threshold voltage of the PMIS transistor 6 than the ground potential VGND. Therefore, there is a problem that a signal at a sufficiently low potential, i.e., a potential close to the ground potential is not output. This problem is particularly serious in a case described below.

FIG. 46 shows a non-ratio type inverter circuit 7 constituted by connecting three circuits, one of which is shown in FIG. 45, in series. FIGS. 47A to 47D show a signal waveform of each section of the non-ratio type inverter circuit 7 shown in FIG. 46 at an operating time.

As shown in FIGS. 47A to 47D, even if the potential applied to the input terminal IN and the inverting input terminal ^IN of the non-ratio type inverter circuit 7 is the supply voltage Vdd and the ground level VGND, the low level of a signal output from an output terminal 01 and an inverted output terminal ^01 is a little higher than the ground level VGND. (In this specification, a symbol "^" represents inversion.) Further, the low level of a signal output from an output terminal 02 and an inverted output terminal ^02 is still higher than the ground level VGND. The low level of a signal output from the last output terminal OUT and the last inverted output terminal ^OUT is much higher than the ground level VGND. Therefore, a circuit using this type of inverter circuit may malfunction.

As described above, if an inverter circuit is constituted by only PMIS transistors, the level of "0" of a signal is higher by the threshold of the PMIS transistor than the ground potential VGND.

In the meantime, if an inverter circuit is constituted by only NMIS transistors, the level of "1" of a signal is lower by the threshold of the NMIS transistor than the supply potential Vdd.

That is, if a circuit is constituted by only either of PMIS or NMIS transistors, the output is reduced by the threshold of the transistor and the operational margin of the next circuit is reduced. Therefore, if the inverter circuits are connected with each other in series and if the inverter circuits are connected to other circuits, the desired performance can not be obtained.

SUMMARY OF THE INVENTION

The present invention is made to solve the above-described problems and the object is to provide a semiconductor device which includes a transistor with the conductive type of either of a PMIS or NMIS transistor wherein the low level of an output signal is approximately equal to the ground potential VGND and the high level of the output signal is approximately equal to the supply potential Vdd.

Another object of the present invention is to provide a semiconductor device constituted by the same conductive type of transistors from which the range of the level of an output signal is wide.

To achieve the above-described objects, a semiconductor device according to the present invention is provided with one conductive type of a first MIS transistor to the input terminal of which high potential is applied, the same conductive type of a second MIS transistor to the input terminal of which low potential is applied as that of the above-described first MIS transistor, an output means connected to the output terminals of the above-described first and second MIS transistors, a non-inverted signal supplying means connected to the gate of the first MIS transistor, an inverted signal supplying means connected to the gate of the second MIS transistor and an output voltage compensating circuit connected to either between the output terminals of the first and second MIS transistors and the above-described inverted signal supplying means or between the output terminals of the first and second MIS transistors and the above-described non-inverted signal supplying means, and is characterized in that rise of the lower potential or a drop of the higher potential output from the above-described output means by the above-described output voltage compensating circuit can be prevented.

BRIEF DESCRIPTION OF THE DRAWINGS

FIGS. 39A to 39F are timing charts showing signal waveforms of sections shown in FIG. 38;

FIGS. 41A to 41F are timing charts for explaining the operation of the gate driver shown in FIG. 40;

DETAILED DESCRIPTION OF THE PREFERRED EMBODIMENTS

Figure 1:
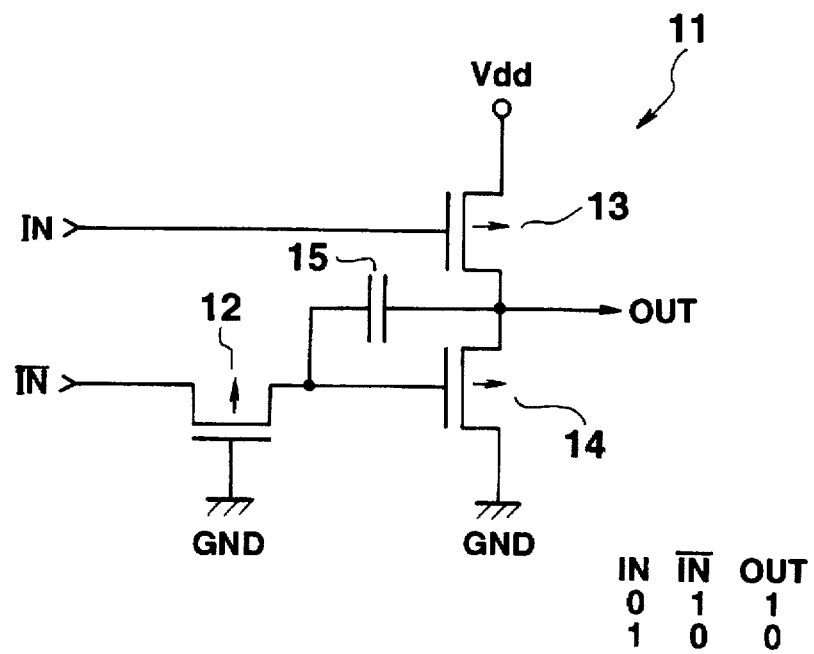
FIG. 1 shows the basic constitution of an inverter circuit according to an embodiment of a semiconductor device according to the present invention.

Embodiments of a semiconductor device according to the present invention and a display drive using this will be described below referring to the drawings.

FIGS. 1 to 43 show an embodiment of a semiconductor device according to the present invention and a display drive using this.

Figure 28:
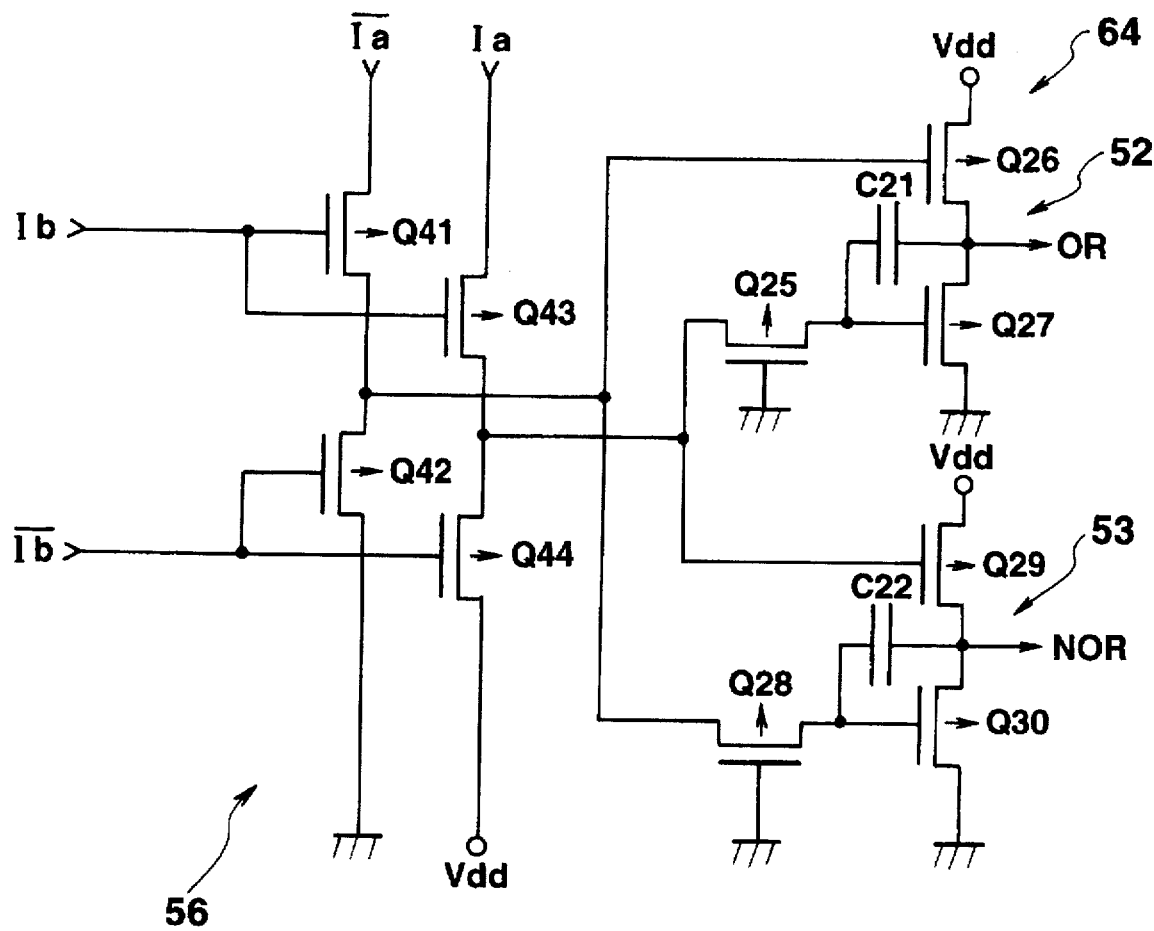
FIG. 28 is a circuit diagram showing an OR/NOR circuit constituted by an NMIS transistor.
Figure 29:
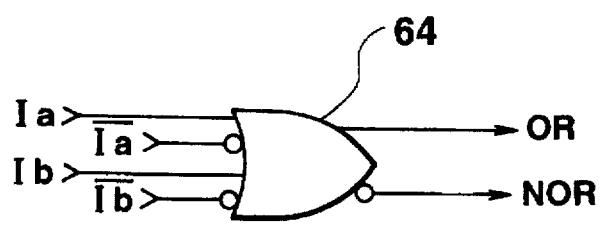
FIG. 29 shows a symbol representing the OR/NOR circuit shown in FIG. 28.
Figure 30:
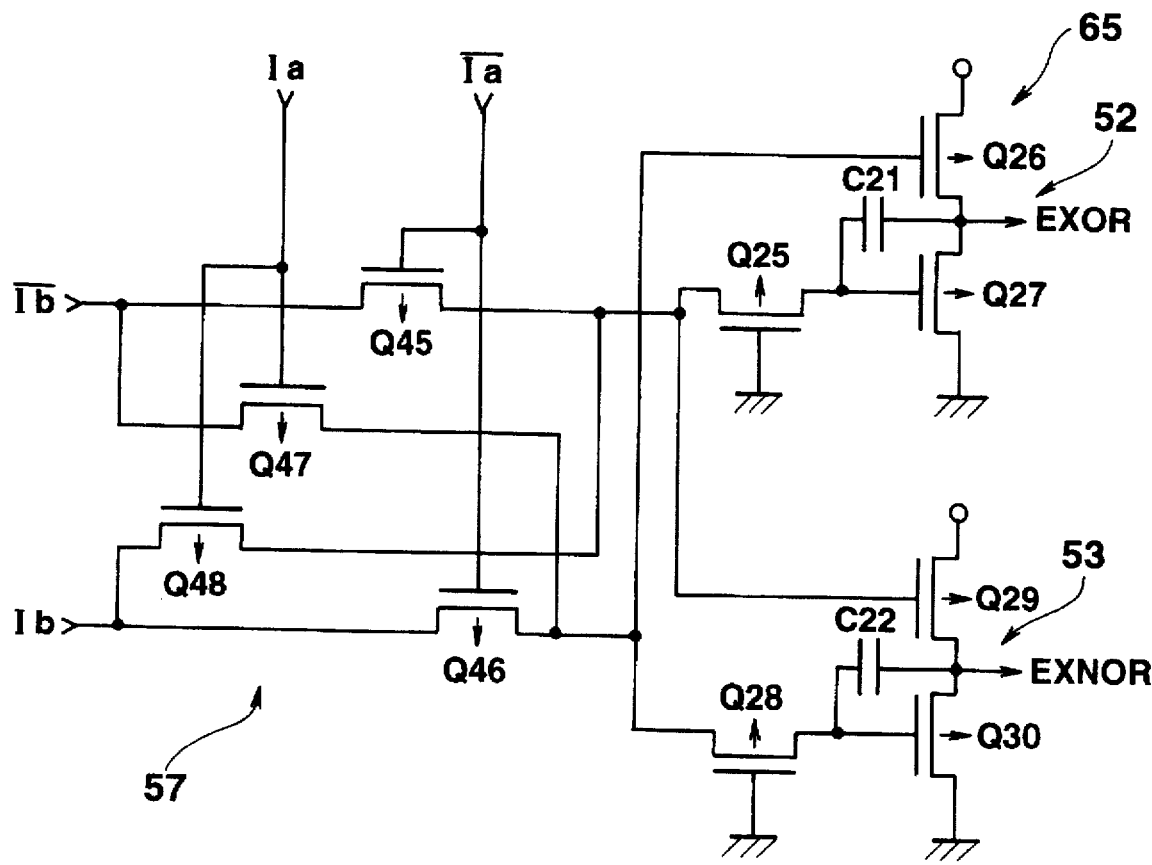
FIG. 30 is a circuit diagram showing an EXOR/EXNOR circuit constituted by an NMIS transistor.
Figure 31:
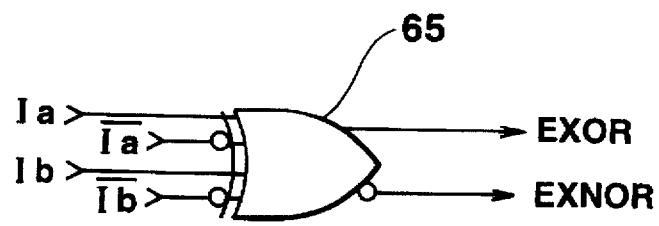
FIG. 31 shows a symbol representing the EXOR/EXNOR circuit shown in FIG. 30.

Referring to FIGS. 1 to 43, FIG. 1 shows the constitution of a basic circuit of a semiconductor device according to the present invention. FIGS. 2 to 16 show an inverter circuit into which the circuits shown in FIG. 1 are combined. FIGS. 17 to 21 show a latch circuit constituted by the circuit shown in FIG. 1 and a plurality of PMIS transistors. FIGS. 22 to 27 show an AND (and NAND) circuit constituted by the circuit shown in FIG. 1 and a plurality of PMIS transistors. FIGS. 28 and 29 show an OR (and NOR) circuit constituted by the circuit shown in FIG. 1 and a plurality of PMIS transistors. FIGS. 30 and 31 show an EXOR (and EXNOR) circuit constituted by the circuit shown in FIG. 1 and a plurality of PMIS transistors. FIGS. 32 to 36 show a tristate circuit constituted by the circuit shown in FIG. 1, a plurality of PMIS transistors and voltage supplies VC, VL and VH. FIGS. 37 to 41F show a liquid crystal display driving circuit provided with a drain driver and a gate driver constituted by the above-described inverter circuit, latch, AND (and NAND) circuit and tristate circuit.

1. Inverter basic circuit

FIG. 1 shows the constitution of an inverter basic circuit according to an embodiment of a semiconductor device according to the present invention. As shown in FIG. 1, an inverter basic circuit 11 according to the present invention is constituted by three PMIS transistors 12 to 14 and a capacitor 15. Any of three PMIS transistors 12 to 14 is a thin film transistor provided with a semiconductor layer formed by non-monocrystalline silicon such as amorphous silicon and polysilicon. The thin film transistor has a gate insulating film of SiN. The transistor may be MOS transistors whose gate insulating film is formed of $SiO_2$. A drain of the PMIS transistors 13 and a source of the PMIS transistor 14 are connected to an output terminal OUT. A source (input terminal) of the PMIS transistor 13 is supplied with a power supply potential Vdd, a drain (input terminal) of the PMIS transistor 14 is supplied with a ground potential VGND. The gate of the PMIS transistor 13 is connected to the input terminal (positive input terminal) IN and an input signal according to the positive or negative logic is applied to the gate. The gate of the PMIS transistor 14 is connected to an inverting input terminal ^IN and the inverted signal of an input signal is applied to the gate.

When a signal at the level of "0" (low level) is input to the input terminal IN and a signal at the level of "1" (high level) is supplied to the inverting input terminal ^IN in the above-described constitution, a signal at the level of "1" is supplied from an output terminal OUT. On the contrary, when a signal at the level of "1" is input to the input terminal IN and a signal at the level of "0" is supplied to the inverting input terminal ^IN, a signal at the low level which is higher than the ground potential VGND is output from the output terminal OUT. The reason is that when the PMIS transistor 14 is turned on, the voltage of an output signal is raised by the threshold voltage higher than the ground potential VGND.

Therefore, in the constitution shown in FIG. 1, an output voltage compensating circuit connected between the inverting input terminal ^IN and the output terminal OUT of the inverter basic circuit 11 is provided so as to prevent the lower potential of a signal output from the PMIS transistor 14 from being higher than the ground potential VGND.

The output voltage compensating circuit is constituted by the PMIS transistor 12 with the same conductive type as the PMIS transistors 13 and 14 and the capacitor 15. The source of the PMIS transistor 12 is connected to the inverting input terminal ^IN, the drain is connected to the gate of the PMIS transistor 14 and one electrode of the capacitor 15. The other electrode of the capacitor 15 is connected to an output terminal OUT. The gate of the PMIS transistor 12 is grounded.

The lower level of a signal output from the output terminal OUT can be dropped up to the same potential as the ground potential VGND by combining the output voltage compensating circuit constituted by the PMIS transistor 12 and the capacitor 15 with the conventional non-ratio type inverter circuit.

The above-described three MIS transistors 12 to 14 are constituted by the same conductive type (herein the same channel type) of transistors. Therefore, the number of processes in which impurities are doped and masks is smaller than that of a CMIS circuit and the manufacturing process is simplified. The costs can be reduced.

Further, as the PMIS transistor 13 serving as a switching transistor is provided on the side of the power supply and the PMIS transistor 14 is provided on the ground side, a signal of which logic is inverted is input to each gate. Therefore, leak current can be reduced and power consumption can be reduced.

2. Inverter circuit

Figure 2:
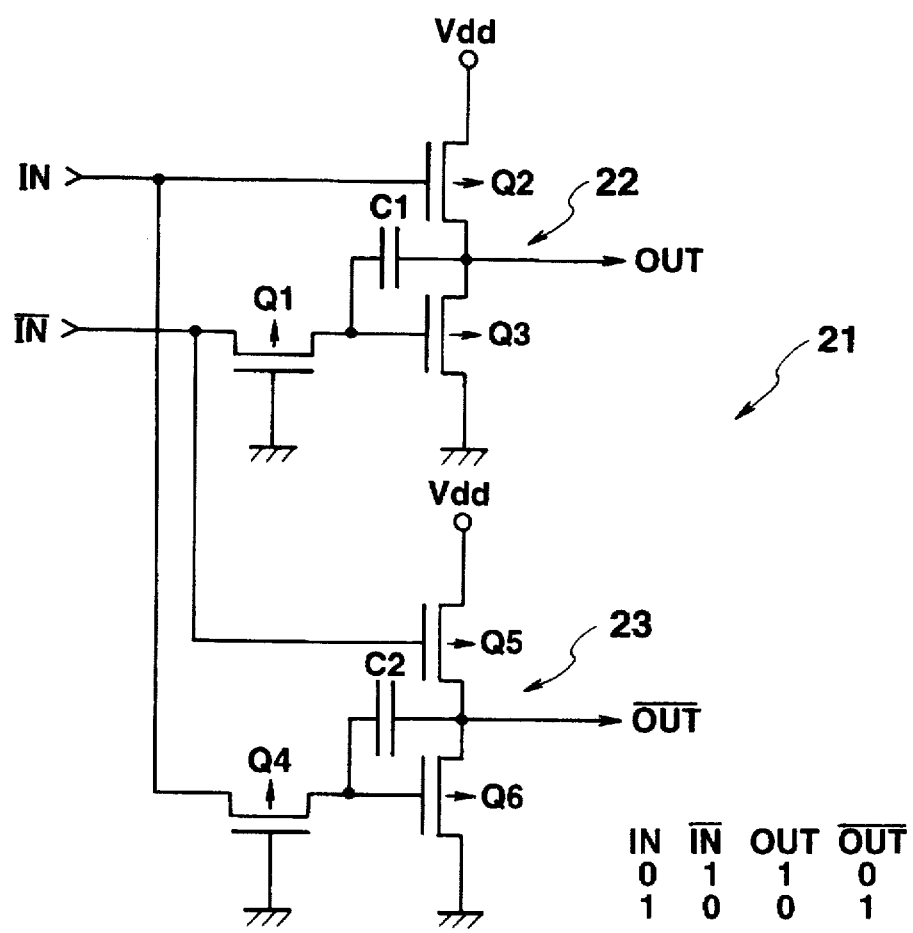
FIG. 2 shows an inverter circuit constituted by two inverter basic circuits shown in FIG. 1 to output inverted signals of a positive logic and negative logic signals.

FIG. 2 shows the constitution of an inverter circuit 21 into which two inverter basic circuits shown in FIG. 1 are combined to output negation of either the positive or negative logic.

First, the constitution will be described. As shown in FIG. 2, the inverter circuit 21 is constituted by combining an inverter basic circuit 22 comprising PMIS transistors Q1 to Q3 and a capacitor C1 and an inverter basic circuit 23 comprising PMIS transistors Q4 to Q6 and a capacitor C2.

In the inverter basic circuit 22, the gate of the PMIS transistor Q2 is connected to an input terminal IN and the gate of the PMIS transistor Q3 is connected to an inverting input terminal ^IN via the PMIS transistor Q1. In the inverter basic circuit 23, the gate of the PMIS transistor Q5 is connected to the inverting input terminal ^IN. The gate of the PMIS transistor Q6 is connected to the input terminal IN via the PMIS transistor Q4.

Next, the operation of the inverter basic circuit 22 will be described.

When a signal at the level of "0" is input to the input terminal IN and a signal at the level of "1" is input to the inverting input terminal ^IN, the PMIS transistor Q2 is turned on, the PMIS transistor Q3 is turned off, supply potential Vdd is applied to the output terminal OUT and a signal at the level of "1" is output to the output terminal OUT. In the inverter basic circuit 23, the PMIS transistor Q5 is turned off, the PMIS transistor Q6 is turned on and a signal at the level of "0" being the ground potential is output to an inverted output terminal ^OUT.

Further, when a signal at the level of "1" is input to the input terminal IN and a signal at the level of "0" is input to the inverting input terminal ^IN, a signal at the level "0" is output from the output terminal OUT, and a signal at the level "1" is output from the output terminal from the inverted output terminal ^OUT.

As described above, in the inverter circuit 21 according to this embodiment, when an input signal and an inverting input signal are input, the negation of them is output from the output terminal OUT and the inverted output terminal ^OUT.

As shown in FIG. 2, the PMIS transistors Q1 and Q4 are connected to the respective gate of the PMIS transistors Q3 and Q6 and the capacitors C1 and C2 are arranged respectively between the PMIS transistor Q1 and the output terminal OUT and between the PMIS transistor Q4 and the inverted output terminal ^OUT. Therefore, when a signal at the low level is output as output and inverted output, the low level can be prevented from being raised. Thus, "1" at the level of the supply voltage Vdd and "0" at the level of the ground potential VGND can be output as output and inverted output.

Figure 3:
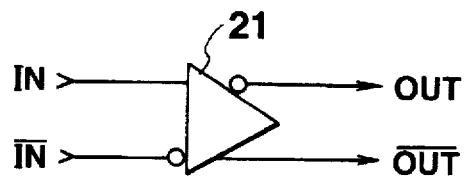
FIG. 3 shows a symbol representing the inventer circuit shown in FIG. 2.

FIG. 3 shows a symbol representing the inverter circuit 21 shown in FIG. 2 and the inverter circuit 21 outputs output OUT of which logic of input is inverted and inverted output ^OUT which negates the output when a signal input through the input terminal IN and inverted input ^IN which negates it are input to the inverter circuit.

Figure 4:
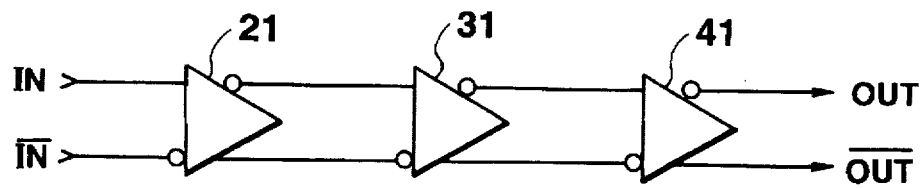
FIG. 4 shows an inverter circuit constituted by the three inverter circuits shown in FIG. 3 are connected in series.
Figure 46:
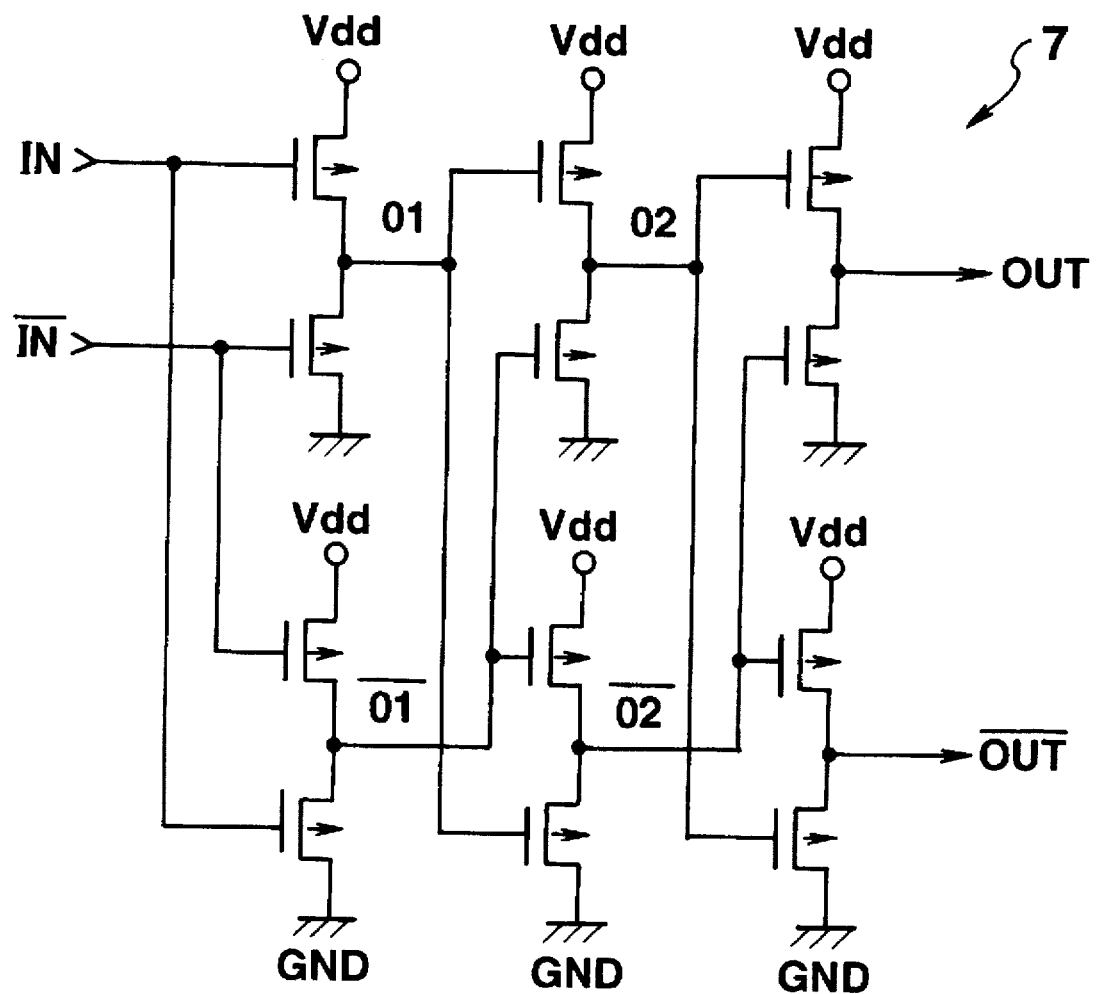
FIG. 46 is a circuit diagram showing the conventional non-ratio type inverter circuit constituted by the circuits shown in FIG. 45.
Figures 47A, 47B, 47C, 47D:
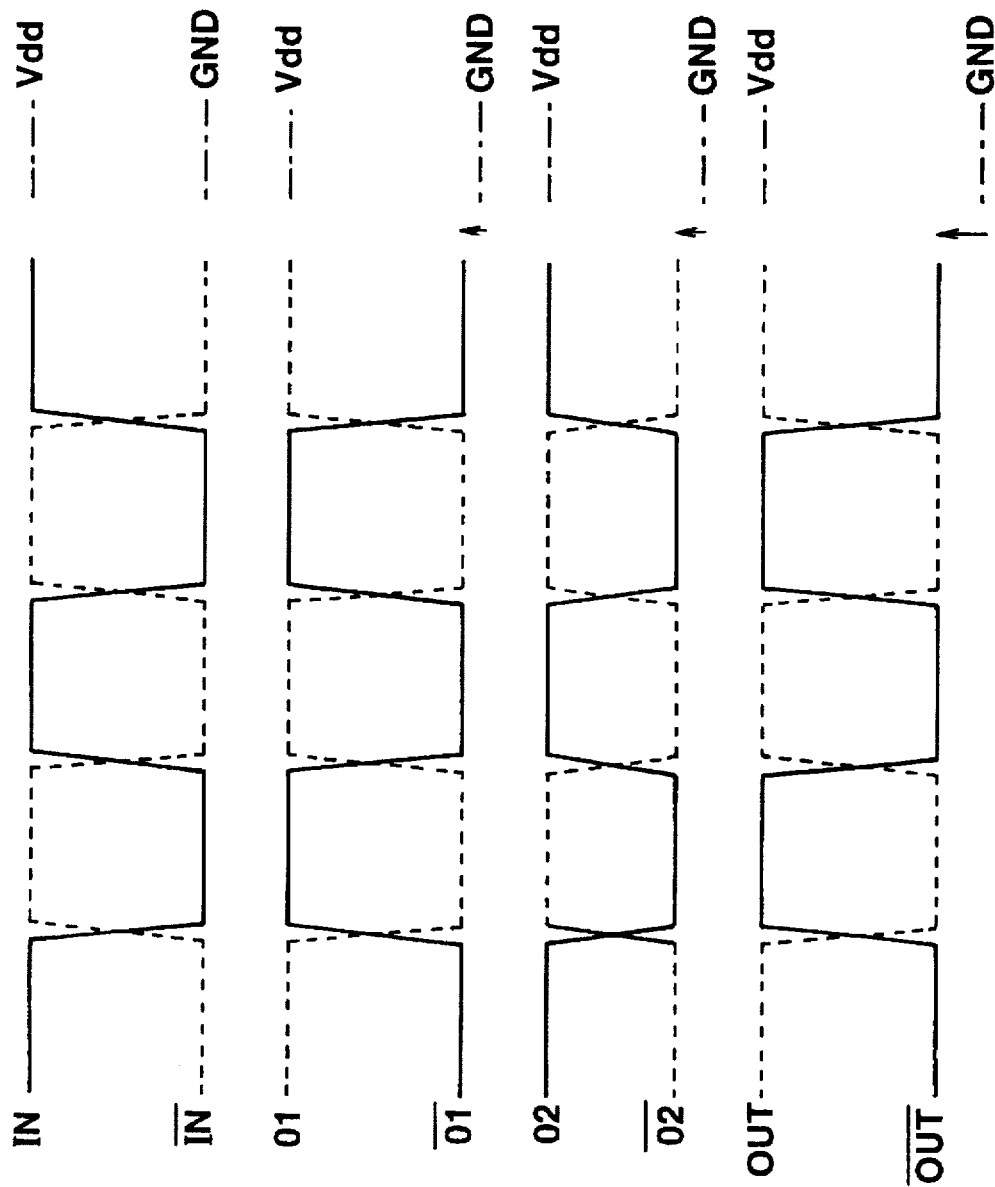
FIGS. 47A to 47D show the signal waveforms for explaining the non-ratio type inverter circuit shown in FIG. 46.

FIG. 4 shows the constitution of a circuit in which three symbols representing the inverter circuit 21 shown in FIG. 3 are connected in series and correspond to the constitution of the circuit according to the prior embodiment shown in FIG. 46. As described above, in the circuit shown in FIGS. 47A to 47D the low level of an output signal is a little bit higher than ground potential VGND when each inverter circuit outputs a signal at the low level. Therefore, when three inverter circuits are connected in series and operated, the total of each raised amount is the last level of output from the inverter circuit 7. Therefore, the output low level is much higher than the ground potential VGND and an appropriate output level cannot be obtained.

Figure 5A:
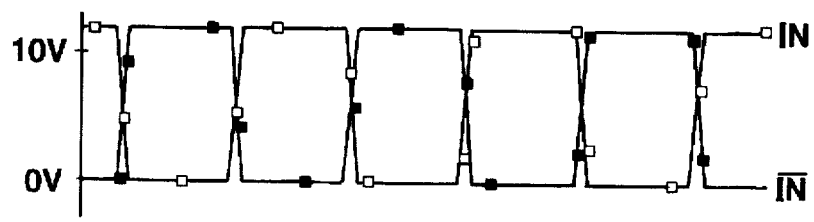
FIGS. 5A and 5B show the wavefroms for explaining the operation of the inverter circuit shown in FIG. 4.
Figure 5B:
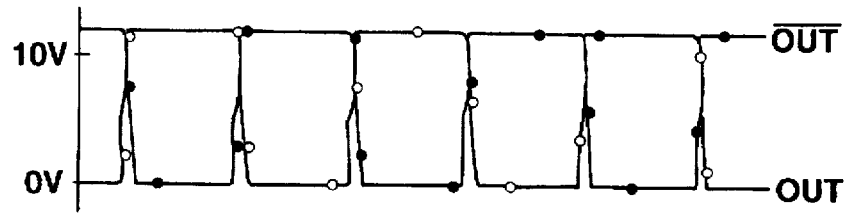

FIGS. 5A and 5B show the result of simulation of an input/output signal when the inverter circuit shown in FIG. 4 is operated. Referring to the PMIS transistors Q1 to Q6 used in simulation in this specification, the length of the channel is 4 μm, the width of the channel is 4 μm, the threshold voltage is −3 V, the mobility in the electric field is 40 cm$^2$/V·S, the capacity of the gate electrode is $1.22 \times 10^{-14}$ F, the source/drain (S/D) resistance is 200 Ω and the voltage of the substrate is equal to the supply voltage Vdd. The capacity of the capacitors C1 and C2 is respectively 0.2 PF.

Even if three inverter basic circuits 21, 31 and 41 are connected in series, the loss of output that the low level is higher than the ground level VGND is not found in the inverter circuit as shown in FIGS. 5A and 5B. That is, appropriate ground potential VGND and supply voltage Vdd can be output from the output terminal OUT or the inverted output terminal ^OUT.

In the inverter circuit according to this embodiment, it can be verified that there is no loss of output as described above, the circuit is operated by the supply voltage Vdd of 12 V and operating frequency of 100 kHz, there is no direct leak current but only transition current flows. Therefore, it can be verified that the above-described circuit is provided with sufficient characteristics for operating speed and current consumption if the circuit is used as a circuit to drive, for example a thin film transistor-liquid crystal display device (TFT-LCD).

The above-described inverter circuit 21 is constituted by PMIS transistors. However, the circuit may be constituted by NMIS transistors instead of PMIS transistors, as described later in detail.

FIGS. 6 to 9 respectively show a circuit into which the inverter circuit 21 shown in FIG. 2 is transformed. The circuit shown in FIGS. 6 to 9 includes the PMIS transistors Q1 to Q6 and capacitors C1 and C2 same as FIG. 2, however, the relationship of connections is varied.

When a signal at the low level is input to the inverting input terminal ^IN, the transistor Q3 in the inverter circuit 21 shown in FIG. 2 is mined on so as to output a signal at the low level. Therefore, the voltage at the drain electrode of the transistor Q3 is not required to be always at the low level and the drain may be connected to the inverting input terminal ^IN.

Figure 6:
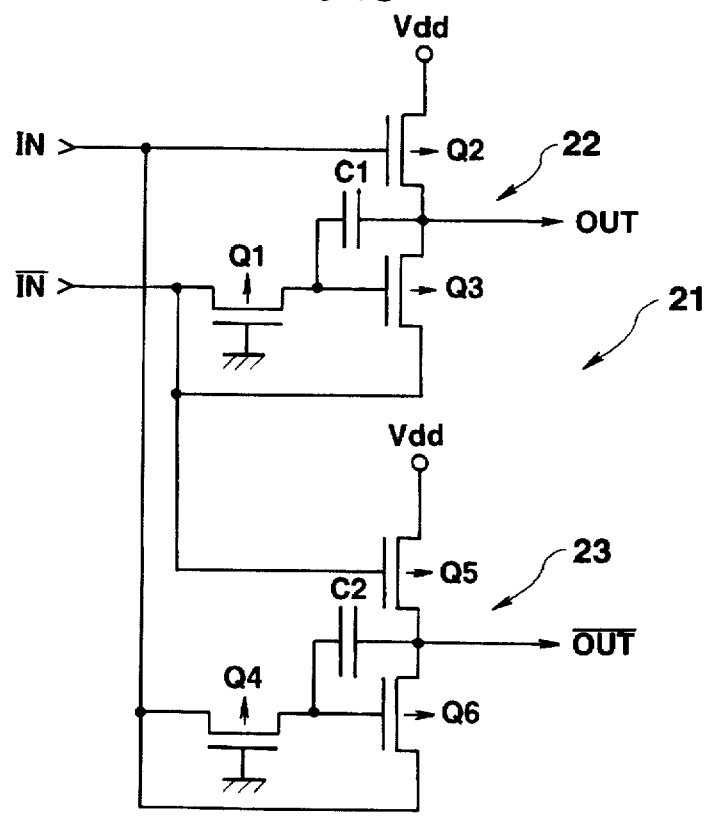
FIG. 6 shows a modified example of the inverter circuit shown in FIG. 2.

Therefore, as shown in FIG. 6, the drain (input terminal) of the transistor Q3 may be connected to an inverting input terminal ^IN to which a signal at the low level is input when the transistor Q3 is mined on, instead of being connected to the ground.

The drain (input terminal) of the transistor Q6 shown in FIG. 6 is connected to an input terminal IN to which a signal at the low level is input when the transistor Q6 is mined on. According to the constitution shown in FIG. 6, the number of grounds can be reduced, wiring can be simplified and power consumption can be reduced.

Next, when a signal at the low level is input to the input terminal IN, the transistor Q2 in the inverter circuit 21 shown in FIG. 2 is turned on so as to output a signal at the high level. Therefore, the source of the transistor Q2 is not required to be always at the high level and a signal at the high level has only to be input to the source only when a signal at the low level is input to the input terminal IN.

Figure 7:
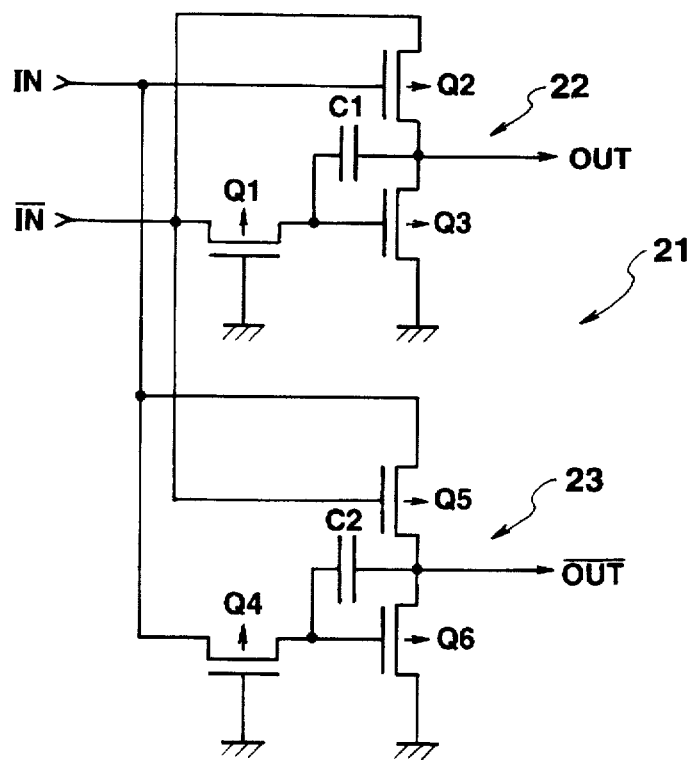
FIG. 7 shows a modified example of the inverter circuit shown in FIG. 2.

Therefore, in FIG. 7, the source electrode (input terminal) of the transistor Q2 may be connected to the inverting input terminal ^IN to which a signal at the high level is input when the transistor Q2 is mined on, instead of being connected to the supply voltage Vdd. Similarly, in FIG. 7, the source (input terminal) of the transistor Q5 is connected to the input terminal IN to which a signal at the high level is input when the transistor Q5 is turned on.

According to the constitution shown in FIG. 7, the number of positions connected to the power supply can be reduced, wiring can be simplified and power consumption can be reduced.

Figure 8:
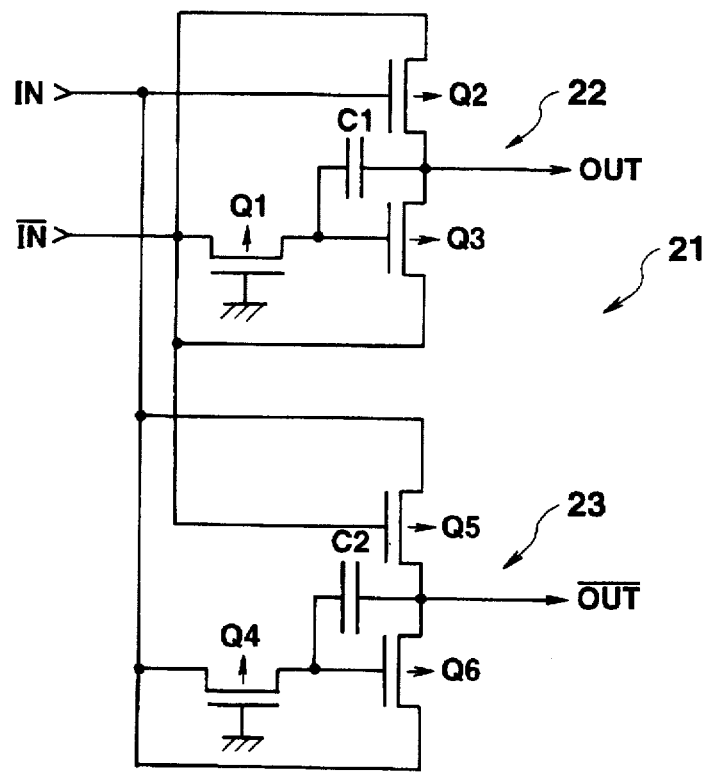
FIG. 8 shows a modified example of the inverter circuit shown in FIG. 2.

Next, as shown in FIG. 8, the respective input terminal of the transistors Q2, Q3, Q5 and Q6 may be connected to an input terminal IN or an inverting input terminal ^IN by the same reason as the above-described case and the same operation as that of the circuit shown in FIG. 2 can be obtained.

Further, in the inverter circuit 21 shown in FIG. 2, the gate electrode of the transistors Q1 and Q4 for a bootstrap for securely outputting a signal at the low level by compensating the gate voltage of the transistors Q3 and Q6 is respectively grounded. However, the transistors Q1 and Q4 are not always required to be on and have only to be turned on when the transistor Q3 or Q6 is turned on and a signal at the low level (at the high level in the case of a NMIS transistor) is input to the gate electrode of the PMIS transistor Q1 or Q4.

Figure 9:
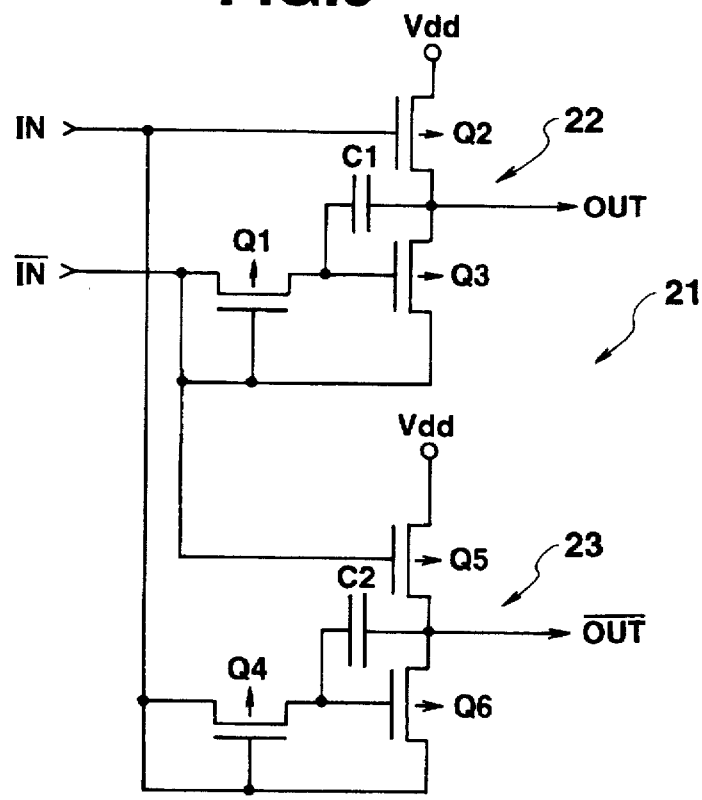
FIG. 9 shows a modified example of the inverter circuit shown in FIG. 2.

Therefore, as shown in FIG. 9, the gate electrode of the transistor Q1 may be connected to an inverting input terminal ^IN to which a signal at the low level is input when the transistor Q3 is turned on, the gate electrode of the transistor Q4 may be connected to an input terminal IN to which a signal at the low level is input when the transistor Q6 is turned on and the same operation can be obtained.

In the constitution shown in FIG. 9, wiring can be simplified and power consumption can be reduced because the number of positions in a transistor connected to the ground or the power supply can be reduced.

Figure 10:
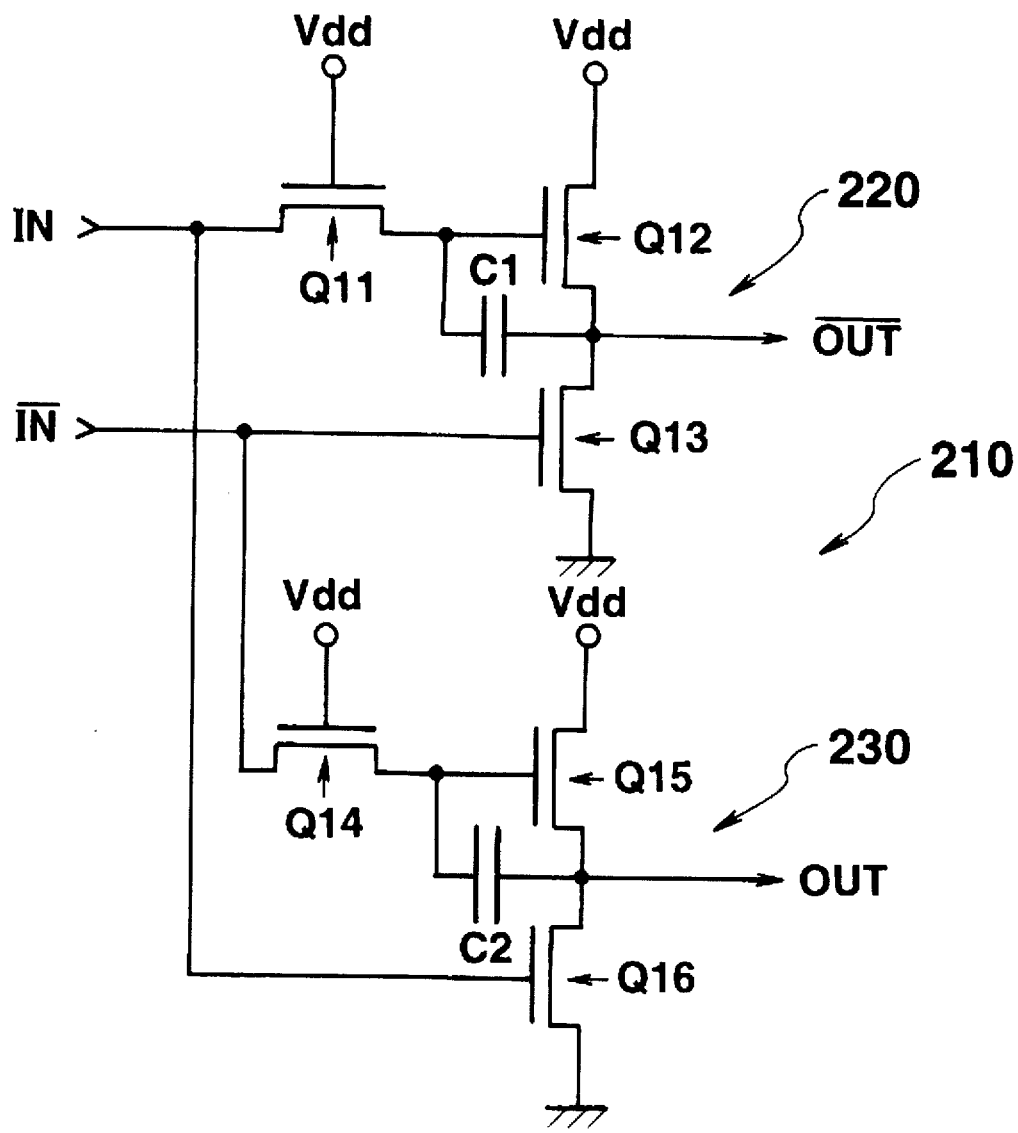
FIG. 10 shows a circuit diagram in case that a NMIS transistors are substituted for the PMIS transistors in the inverter circuit shown in FIG. 2.

The inverter circuits shown in FIGS. 1 to 9 are formed by the PMIS transistors, however, the inverter circuits may be constituted by the NMIS transistors, for example, as shown in FIG. 10.

The inverter circuit 210 shown in FIG. 10 includes an inverter basic circuit 220 and an inverter basic circuit 230.

The inverter basic circuit 220 is constituted by an NMIS transistor Q11 one end of a current path of which is connected to an input terminal IN and to the gate electrode of which supply voltage Vdd is applied; an NMIS transistor Q12 the gate electrode of which is connected to the other end of the current path of the NMIS transistor Q11, to the drain electrode (input terminal) of which supply voltage Vdd is applied and the source electrode (output terminal) of which is connected to an inverted output terminal ^OUT of the inverter basic circuit 210; an NMIS transistor Q13 the gate electrode of which is connected to an inverting input terminal ^IN, to the source electrode (input terminal) of which ground voltage VGND is applied and the drain electrode (output terminal) of which is connected to the inverted output terminal ^OUT; and a capacitor C1 one end of which is connected to the gate electrode of the NMIS transistor Q12 and the other end of which is connected to the inverted output terminal ^OUT.

The inverter basic circuit 230 is constituted by an NMIS transistor Q14 one end of a current path of which is connected to the inverting input terminal ^IN and to the gate electrode of which supply voltage Vdd is applied; an NMIS transistor Q15 the gate electrode of which is connected to the other end of the current path of the NMIS transistor Q14, to the drain electrode (input terminal) of which supply voltage Vdd is applied and the source electrode (output terminal) of which is connected to an output terminal OUT of the inverter basic circuit 210; an NMIS transistor Q16 the gate electrode of which is connected to the input terminal IN, to the source electrode (input terminal) of which ground voltage VGND is applied and the drain electrode (output terminal) of which is connected to the output terminal OUT; and a capacitor C2 one end of which is connected to the gate electrode of the NMIS transistor Q15 and the other end of which is connected to the output terminal OUT.

Figure 11:
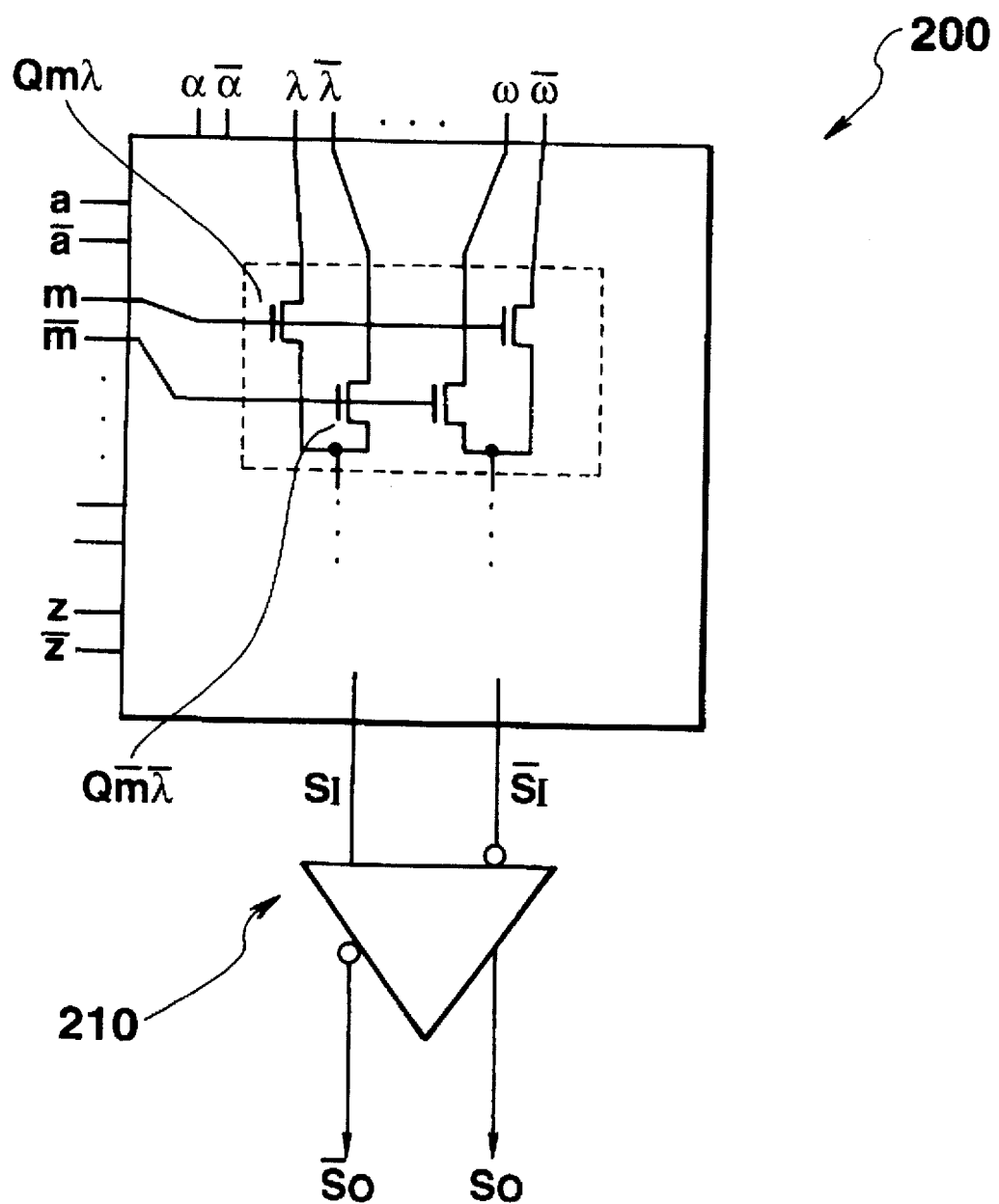
FIG. 11 shows a circuit in which the inverter circuit shown in FIG. 2 and a bus logic circuit are connected with each other.

FIG. 11 shows a circuit in which the NMIS inverter circuit 210 shown in FIG. 10 is connected to the output terminal of a well-known bus logic circuit 200. The bus logic circuit 200 is a circuit developed for low power consumption, high throughput and large scale integration and is constituted by a large number of the NMIS transistors Qaα, Q(^aα) to Qzω, Q(^zω) via QmΛ, Q(^mΛ) arranged in a network fashion in row and column directions. The gate electrode of each NMIS transistor is connected to associated one of row address buses a, (^a) to z, (^z) via m, m, (^m) and the input terminal of each NMIS transistor is connected to associated one of column address buses α, (^α) to ω, (^ω) via λ, (^λ).

Two NMIS transistors connected to a row address bus to which a signal is applied and a row address bus to which an inverted signal is applied constitute a pair, the output terminals of which are connected with each other. For example, the output terminals of the NMIS transistors QmΛ and Q(^mΛ) are connected with each other and the output terminals of the NMIS transistors Q(m^ω) and Q(^mω) are connected with each other.

The inverter circuit 210 consisted by the NMIS transistors is connected to the output terminals SI and ^SI of an NMIS bus transistor logic network 200.

Figure 12A:
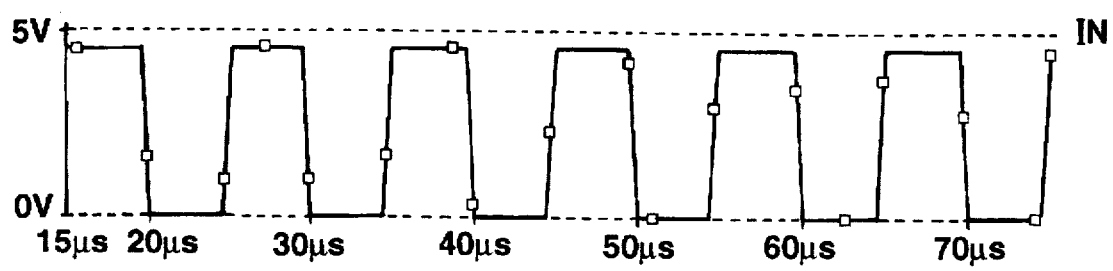
FIGS. 12A and 12B show waveforms of input and output signals of the inverter circuit shown in FIG. 11.
Figure 12B:
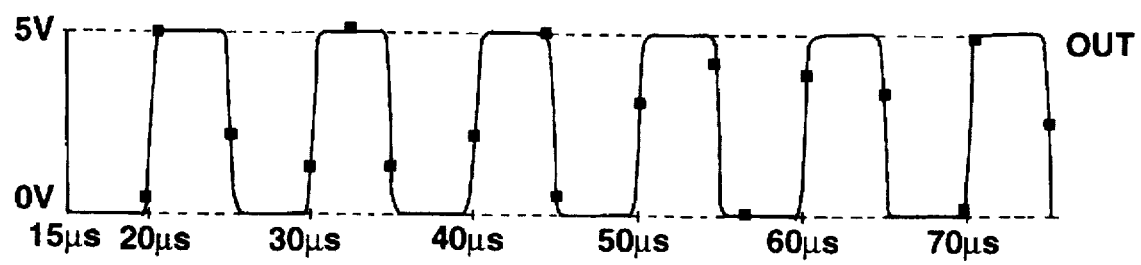

FIGS. 12A and 12B show the result of simulation of the operation of the circuit shown in FIG. 11. FIG. 12A shows the waveform of a signal output from the output terminals SI and ^SI of the bus logic circuit 200 shown in FIG. 11 and FIG. 12B shows the waveform of a signal output from the output terminals SO and ^SO of the NMIS inverter circuit 210. As shown in FIG. 12A, the high level of a signal output from the NMIS bus logic circuit 200 is lower than the supply potential Vdd of 5 V. It is because the high level of a signal output from the NMIS bus logic circuit 200 is lower than the supply potential Vdd of 5 V by the threshold voltage of the NMIS transistors constituting the bus logic circuit 200. However, as shown in FIG. 12B, the high level of the waveform output from the NMIS inverter circuit 210 is equal to the supply potential Vdd of 5 V. It is verified that the inverter circuit 210 has effect to prevent a drop of the potential at the high level as described above.

The constitution of the inverter circuit 210 including the above-described NMIS transistors shown in FIG. 10 has some variations shown in FIGS. 13 to 16.

When a signal at the high level is input to the input terminal IN, the transistor Q12 in the inverter circuit 210 shown in FIG. 10 is turned on to output a signal at the high level. Therefore, the drain electrode of the transistor Q12 is not always required to be at the high level and has only to be turned to the high level when a signal at the high level is input to the input terminal IN.

Figure 13:
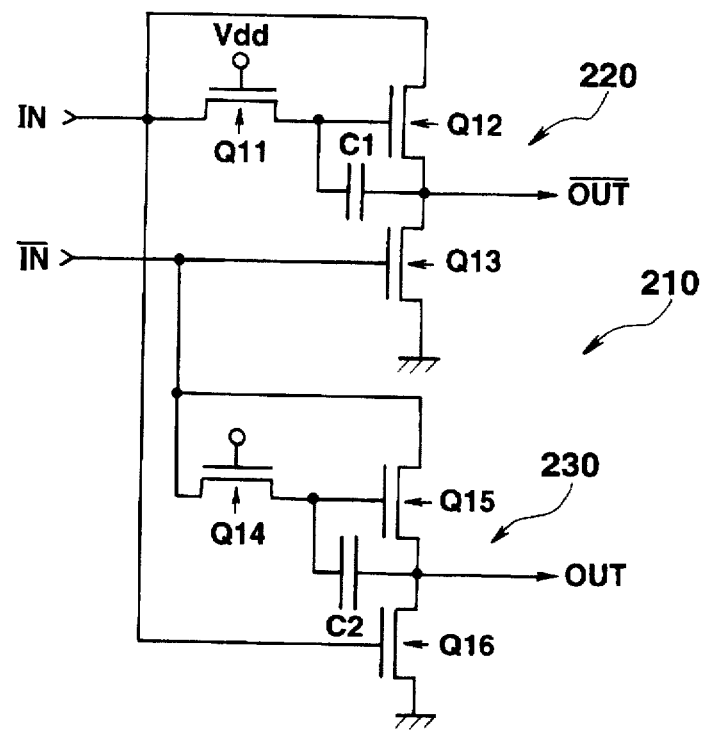
FIGS. 13 to 16 show modified examples of the inverter circuit shown in FIG. 10.

Therefore, as shown in FIG. 13, the drain electrode (input terminal) of a transistor Q12 may be connected to an input terminal IN turned to the high level when the transistor Q12 is turned on instead of being connected to the power supply and substantially the same operation as in the circuit shown in FIG. 10 can be obtained. The drain electrode of a transistor Q15 is also connected to an inverting input terminal ^IN turned to the high level when the transistor Q15 is turned on instead of being connected to the power supply. According to the constitution shown in FIG. 13, the number of connections of the NMIS transistor with the power supply is reduced, wiring is simplified and power consumption is reduced.

Figure 14:
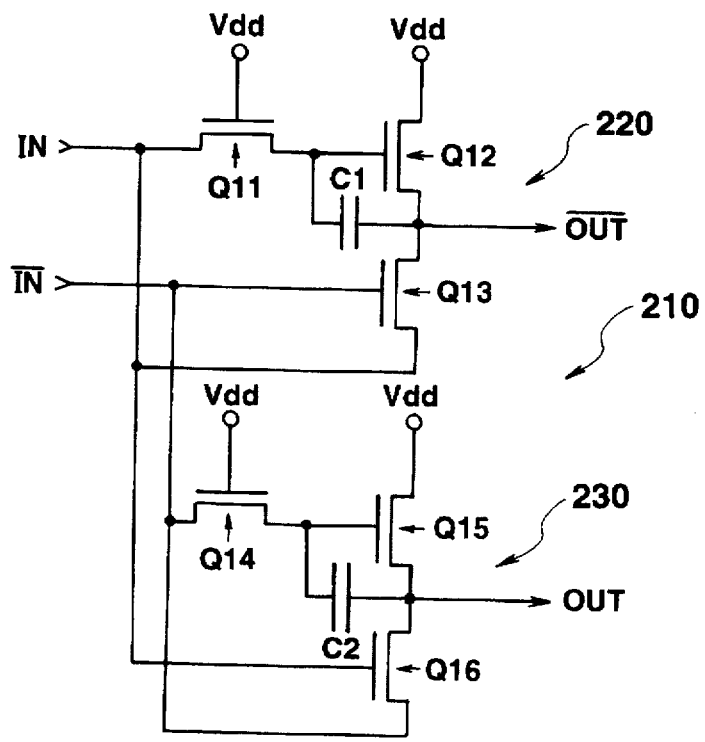

When the voltage at the inverting input terminal ^IN is at the high level, the transistor Q13 in the inverter circuit 210 shown in FIG. 10 is turned on to output a signal at the low level. Therefore, the voltage at the source electrode of the transistor Q13 is not always required to be at the low level and has only to be turned to the high level when a signal at the high level is input to the inverting input terminal ^IN. Therefore, as shown in FIG. 14, the source electrode (input terminal) of a transistor Q13 may be connected to an input terminal IN turned to the low level when the transistor Q13 is turned on instead of being grounded and substantially the same operation as in the circuit shown in FIG. 10 can be obtained. Similarly, the source electrode (input terminal) of a transistor Q16 may be connected to an inverting input terminal ^IN turned to the low level when the transistor Q16 is turned on.

According to the constitution shown in FIG. 14, the number of grounded positions is reduced, wiring is simplified and power consumption is reduced.

Figure 15:
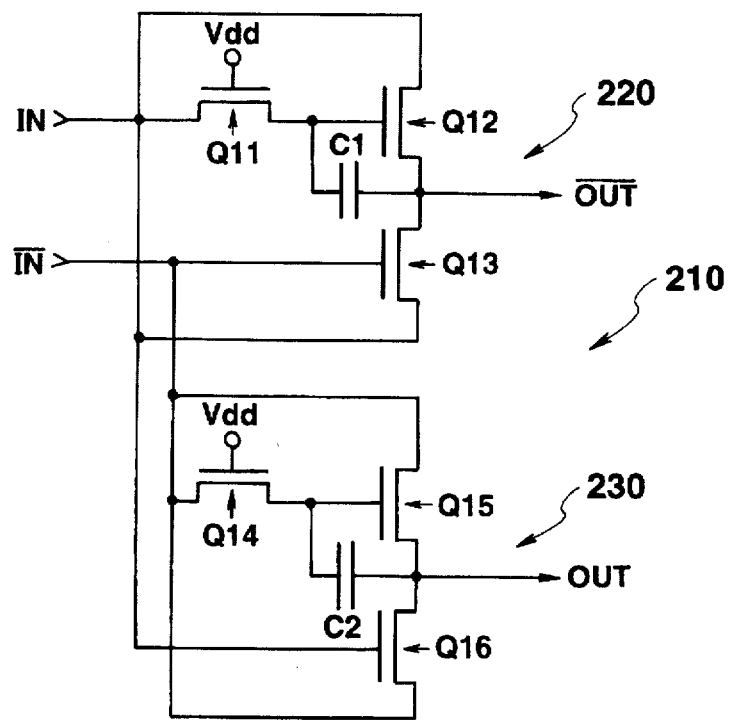

As shown in FIG. 15, the drain electrode of a transistor Q12 and the source electrode of a transistor Q14 may be respectively connected to an input terminal IN and the drain electrode of a transistor Q15 and the source electrode of a transistor Q16 may be respectively connected to an inverting input terminal ^IN. In such constitution, the same operation as in the circuit shown in FIG. 10 can be also obtained.

Further, the transistors Q11 and Q14 for bootstrap are not always required to be turned on and have only to be turned on when the transistor Q12 or Q15 is turned on.

Figure 16:
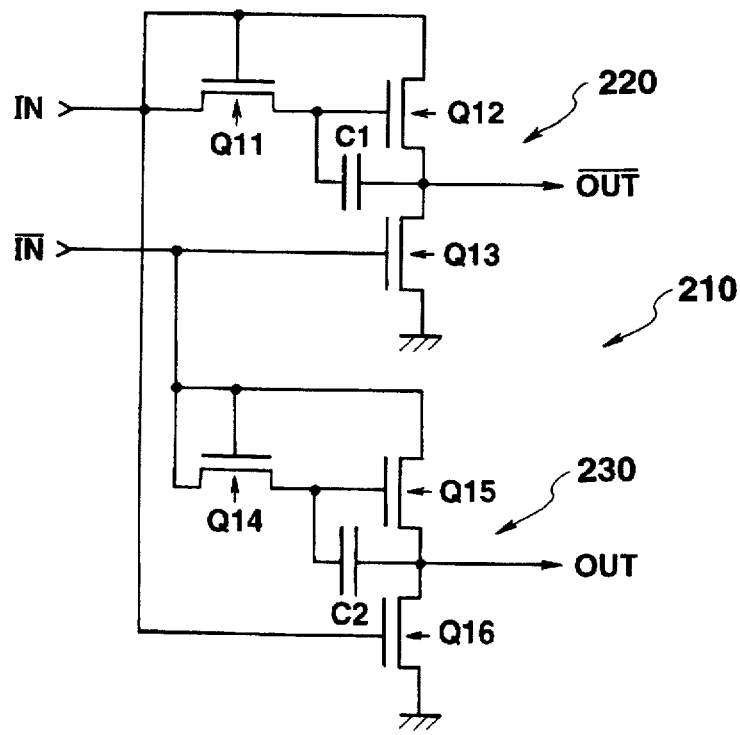

Therefore, as shown in FIG. 16, the gate electrode of a transistor Q11 may be connected to an input terminal IN turned to the high level when a transistor Q12 is turned on, instead of connecting the gate electrode of the transistor Q11 or Q14 to the power supply. And, the gate electrode of the transistor Q14 may be also connected to an inverting input terminal ^IN turned to the high level when a transistor Q15 is turned on. According to the constitution shown in FIG. 16, substantially the same operation as in the inverter circuit shown in FIG. 10 can be obtained.

As described above, the number of connections in a transistor with the ground or power supply can be also reduced further by constituting the circuit as shown in FIGS. 13 to 16. Therefore, wiring can be simplified and power consumption can be reduced.

3. Latch circuit

Figure 17:
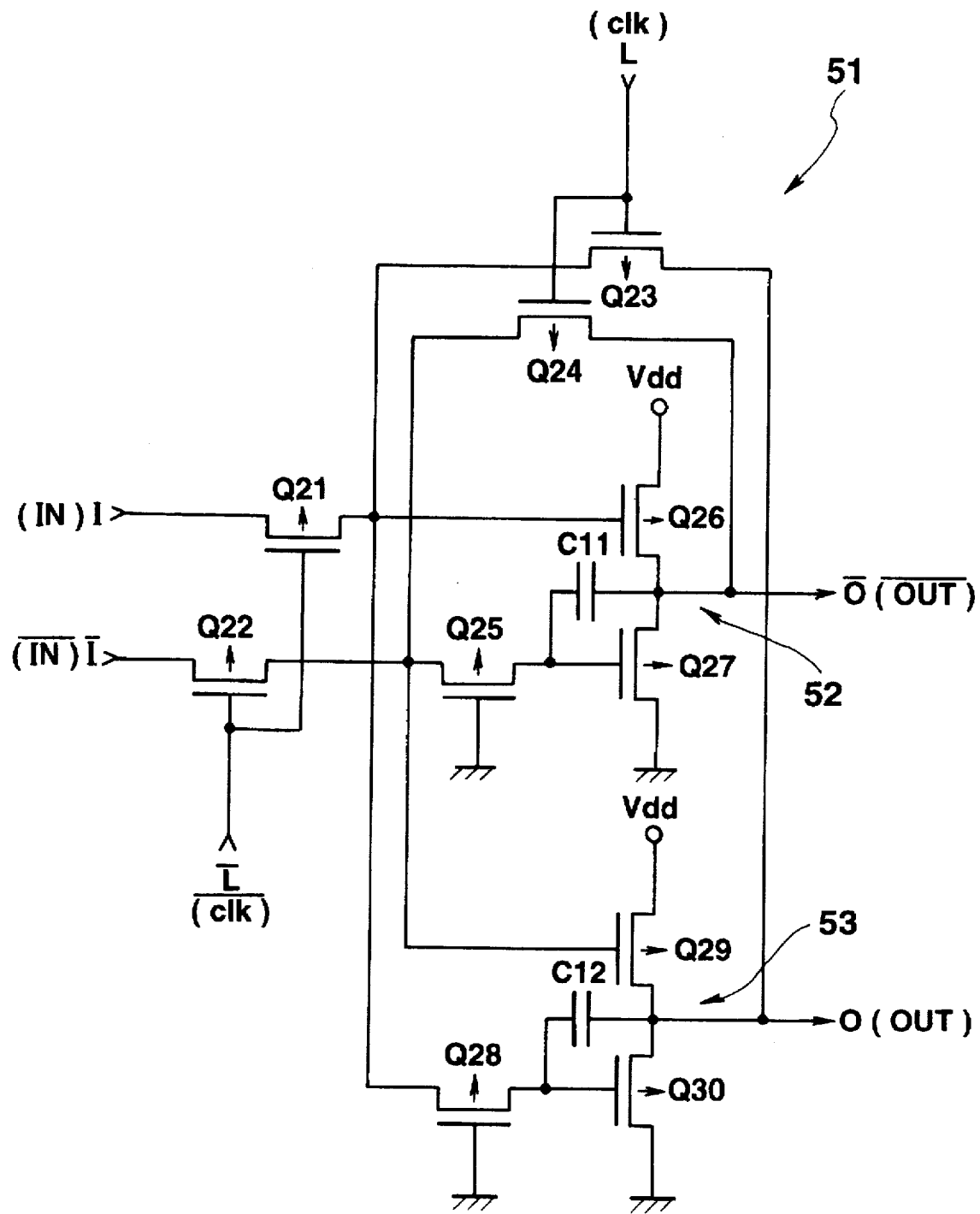
FIG. 17 shows a latch circuit constituted by the basic circuits shown in FIG. 1.

FIG. 17 shows a latch circuit 51 constituted by a plurality of inverter basic circuits shown in FIG. 1.

First, the constitution will be described.

The latch circuit 51 shown in FIG. 17 is constituted by an inverter circuit including two inverter basic circuits 52 and 53, switching transistors Q21 and Q22 and transistors Q23 and Q24 for feedback.

The inverter basic circuit 52 is constituted by PMIS transistors Q25 to Q27 and a capacitor C11. The inverter basic circuit 53 is constituted by PMIS transistors Q28 to Q30 and a capacitor C12.

One end of a current path of the PMIS transistor Q21 is connected to an input terminal IN and the other end of the current path is connected to the gate of the PMIS transistor Q26 and one end of a current path of the transistor Q28. One end of a current path of the PMIS transistor Q22 is connected to an inverting input terminal AIN and the other end of the current path is connected to the gate of the PMIS transistor Q29 and one end of a current path of the transistor Q25. An inverting clock signal ^clk for switching is input from an inversion control signal input terminal ^L to the gate of the PMIS transistors Q21 and Q22.

One end of a current path of the PMIS transistor Q23 for feedback is connected to the other end of the current path of the PMIS transistor Q21 and the other end of the current path is connected to the output terminal OUT of the inverter basic circuit 53. One end of a channel to the PMIS transistor Q24 for feedback is connected to the other end of the current path of the PMIS transistor Q22 and the other end of the channel is connected to the output terminal ^OUT of the inverter basic circuit 52.

The gates of the above-described PMIS transistors Q23 and Q24 are connected to a control signal input terminal L and a clock signal clk for controlling switching is supplied.

As described above, the latch circuit 51 shown in FIG. 17 is equal to the constitution in which four PMIS transistors Q21 to Q24 are added to the inverter circuit shown in FIG. 2. The PMIS transistors Q21 to Q24 set the latch circuit 51 in a through-state or latch-state according to a control signal clk or ^clk from an external device.

Figure 18:
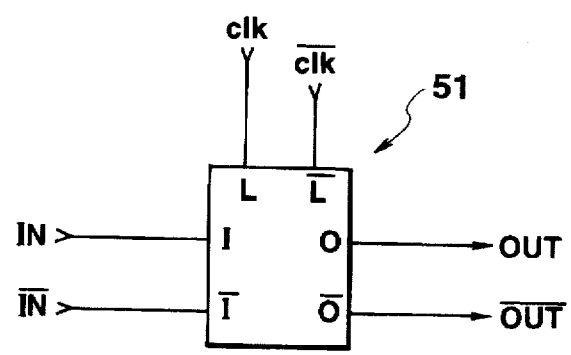
FIG. 18 shows a symbol representing the latch circuit shown in FIG. 17.

FIG. 18 shows a symbol representing the latch circuit 51 shown in FIG. 17. An input signal IN is supplied to an input terminal I, an inverting input signal ^IN to an inverting input terminal ^I, a clock signal clk to a control signal input terminal L and an inverting dock signal ^clk is to an inverting control signal input terminal ^L. An output signal OUT and an inverted output signal ^OUT are respectively output from an output terminal O and an inverted output terminal ^O.

Figure 19A:
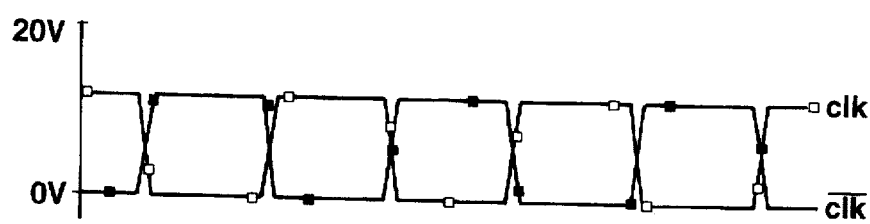
FIGS. 19A to 19C show waveforms of the input/output signals of the latch circuit shown in FIG. 17, for explaining the operation thereof.
Figure 19B:
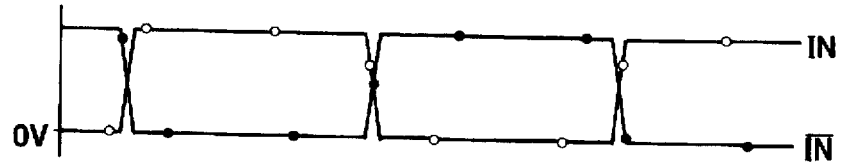
Figure 19C:
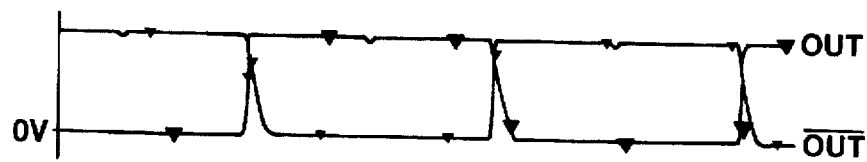

Next, the operation of the latch circuit shown in FIG. 17 will be described. FIGS. 19A to 19C show the result of simulation of an input/output signal when the latch circuit 51 is operated. FIG. 19A shows a clock signal clk and an inverted clock signal ^clk and FIG. 19B shows an input signal IN and an inverting input signal ^IN. FIG. 19C shows an output signal OUT and the inverted output signal ^OUT.

The latch circuit 51 is set at a through-state if a clock signal clk is at the level of "1" and an inverted clock signal ^clk is at the level of "0". The latch circuit 51 is set at a latch-state if a clock signal clk is at the level of "0" and an inverted clock signal ^clk is at the level of "1".

The through-state means a state in which a signal IN input from an input terminal ^I is output to an output terminal O as an output signal OUT as it is and an inverting input signal ^IN from an inverting input terminal ^I is output to an inverted output terminal ^O as an inverted output signal ^OUT as it is.

The latch-state means a state in which output signals are held.

More specifically, as shown in FIG. 19A, if a clock signal clk is at the level of "1" and an inverted clock signal ^clk is at the level of "0", PMIS transistors Q23 and Q24 are mined off and PMIS transistors Q21 and Q22 are turned on. Therefore, the latch circuit 51 is set at through-state in which input signals are output as they are. As shown in FIG. 19B, when an input signal IN is at the level of "0" and an inverting input signal ^IN is at the level of "1", PMIS transistors Q27 and Q29 are turned off and PMIS transistors Q26 and Q30 are turned on. Therefore, as shown in FIG. 19C, an output signal OUT is mined to the level of "0" and the inverted output signal ^OUT is mined to the level of "1".

Next, when a clock signal clk is turned to the level of "0" and an inverted clock signal ^clk is turned to the level of "1", the PMIS transistors Q23 and Q24 are turned on and the PMIS transistors Q21 and Q22 are turned off.

Therefore, an output signal OUT at the level of "0" in the prior state is latched and is feedbacked to the gate of the PMIS transistors Q26 and Q30 via the PMIS transistor Q23 to turn on the transistors Q26 and Q30, independent of an input signal IN and an inverting input signal ^IN. The inverted output signal ^OUT at the level of "1" is feedbacked to the gate of PMIS transistors Q27 and Q29 via the PMIS transistor Q24 to turn off PMIS transistors Q27 and Q29. Therefore, as shown in FIG. 19C, the prior output state is held.

As the latch circuit 51 is constituted by inverter basic circuits shown in FIG. 1, loss of output can be reduced and power consumption can be also reduced.

Figure 20:
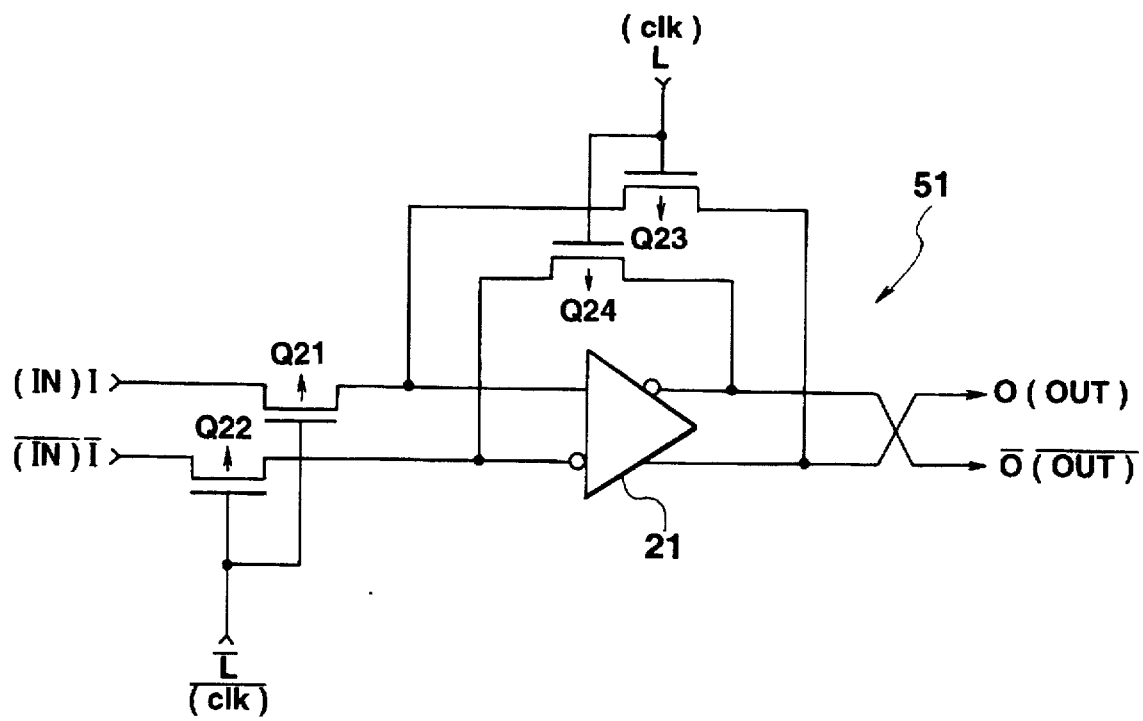
FIG. 20 is a circuit diagram of the latch circuit constituted by PMIS transistors.

FIG. 20 is a circuit diagram in which the inverter circuit 21 in the latch circuit 51 shown in FIG. 17 is replaced with a symbol. As shown in FIG. 20, the latch circuit 51 is provided with the PMIS transistors Q21 to Q24 at the input/output terminal of the inverter circuit 21 shown in FIG. 2 and controls turning on or off the PMIS transistors Q21 to Q24 according to a clock signal clk and an inverted clock signal ^clk.

The inverter circuit 21 shown in FIG. 20 may be constituted by the inverter circuits shown in FIGS. 6 to 9. If the constitution shown in FIGS. 6 to 9 is adopted, the number of connections of PMIS transistors constituting the inverter circuit 21 with power supply or the ground is reduced, wiring in the circuit is simplified and further, power consumption is reduced.

Figure 21:
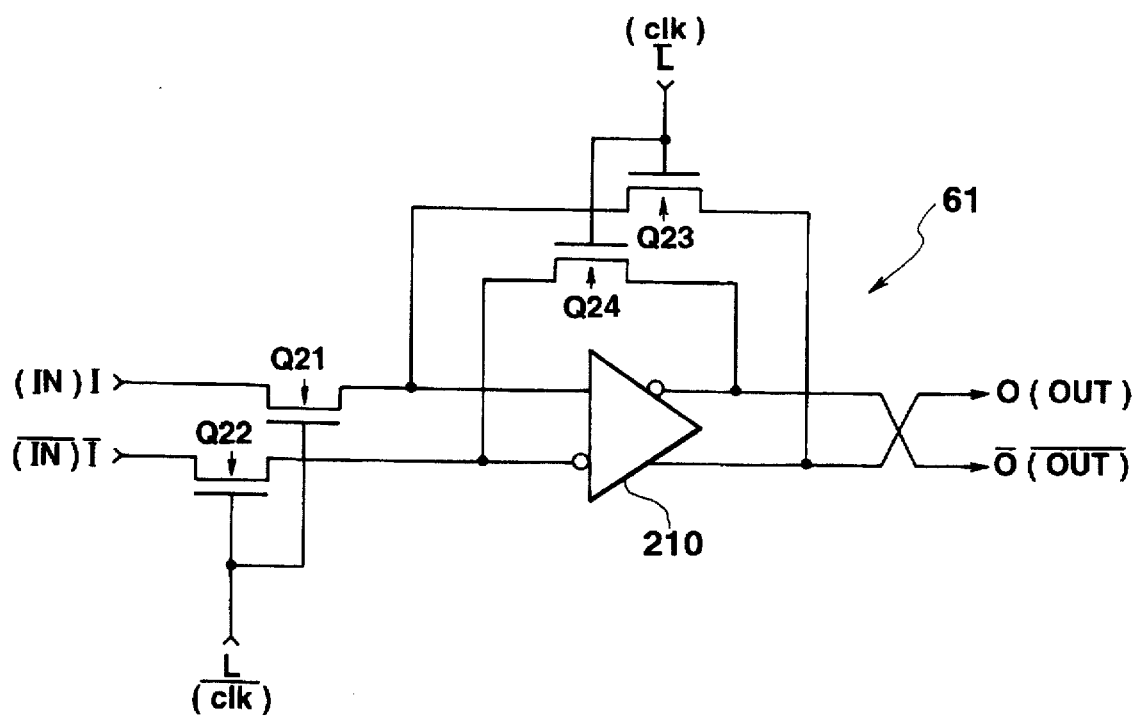
FIG. 21 is a circuit diagram of the latch circuit constituted by NMIS transistors.

FIG. 21 shows the constitution of a latch circuit 61 consisting of NMIS transistors. The latch circuit 61 is provided with the inverter circuit 210 shown in FIG. 10 and NMIS transistors Q21 to Q24 connected to the input/output terminal of the inverter circuit 210 and controls turning on or off the NMIS transistors Q21 to Q24 according to a clock signal clk and an inverted clock signal ^clk.

For an inverter circuit 210, the inverter circuit shown in FIGS. 13 to 16 may be used. The number of connections of the NMIS transistor constituting the inverter circuit 210 with power supply or the ground is reduced, wiring in the circuit is simplified and power consumption is also reduced.

4. AND circuit

Figure 22:
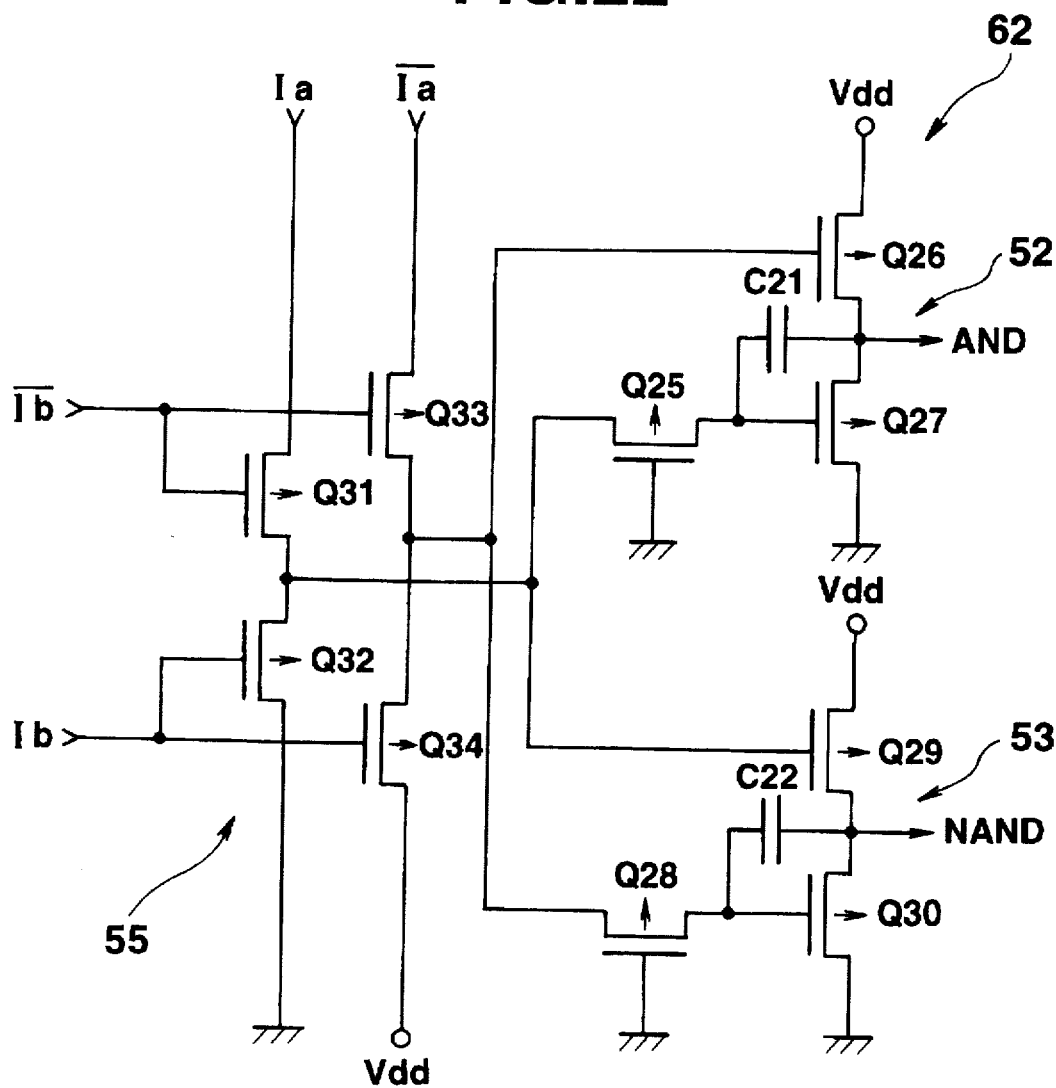
FIG. 22 is a block diagram showing an AND/NAND circuit constituted by the inverter basic circuit shown in FIG. 1 and PMIS transistors.

FIG. 22 is a block diagram showing an AND/NAND circuit constituted by the inverter basic circuit shown in FIG. 1 and a PMIS transistor.

First, the constitution of the AND/NAND circuit 62 shown in FIG. 22 will be described.

The AND/NAND circuit 62 comprises a logic circuit 55 for obtaining AND and NOT of the AND of input signals Ia and Ib, and inverter basic circuits 52 and 53 for shaping a signal output from the logic circuit 55.

The logic circuit 55 is provided with PMIS transistors Q31 to Q34. One ends of current paths of the PMIS transistors Q31 and Q32 are connected with each other. One ends of current paths of the PMIS transistors Q33 and Q34 are connected with each other. An input signal Ia is applied to the other end of the current path of the PMIS transistor Q31. The other end of the current path of the PMIS transistor Q32 is grounded. The inverted input signal ^Ia is applied to the other end of the current path of the PMIS transistor Q33. The power supply voltage Vdd is applied to the other end of the current path of the PMIS transistor Q34.

An input signal Ib is supplied to the gate of the PMIS transistors Q32 and Q34 and the inverted input signal ^Ib is input to the gate of the PMIS transistors Q31 and Q33.

The PMIS transistors Q31 to Q34 are switched by an input signal ^Ib and the inverted input signal ^Ib, AND of input signals Ia and Ib is output to a junction between the PMIS transistors Q31 and Q32 according to the result of switching and NOT of the AND of input signals Ia and Ib is output to a junction between the PMIS transistors Q33 and Q34.

The low level of a signal output from the logic circuit 55 is higher by the threshold voltage of the PMIS transistors Q32 and Q33 than the ground potential VGND. Therefore, in the AND/NAND circuit 62, the output level is corrected by supplying the output from the logic circuit 55 to the inverter basic circuits 52 and 53. That is, the inverter basic circuits 52 and 53 are provided with the same constitution as the inverter basic circuits 52 and 53 shown in FIG. 17 and the low level of an output signal is lowered up to equal potential with the ground potential VGND.

Next, the operation of the AND/NAND circuit shown in FIG. 22 will be described.

If an input signal Ia is "0" (the inverted input signal ^Ia is "1") and an input signal Ib is "0" (the inverted input signal ^Ib is "1"), the transistors Q31 and Q33 are turned off and the transistors Q32 and Q34 are turned on. Therefore, the transistors Q26 and Q30 are turned off and the PMIS transistors Q27 and Q29 are turned on. Therefore, the output from the AND circuit is "0" and the output from the NAND circuit is "1".

Similarly, if an input signal Ia is "0" (the inverted input signal ^Ia is "1") and an input signal Ib is "1" (the inverted input signal ^Ib is "0"), the output from the AND circuit is "0" and the output from the NAND circuit is "1". Also, if an input signal Ia is "1" (the inverted input signal ^Ia is "0") and an input signal Ib is "0" (the inverted input signal ^Ib is "1"), the output from the AND circuit is "0" and the output from the NAND circuit is "1". Further, if an input signal Ia is "1" (the inverted input signal ^Ia is "0") and an input signal Ib is "1" (the inverted input signal −Ib is "0"), the output from the AND circuit is "1" and the output from the NAND circuit is "0".

Figure 23:
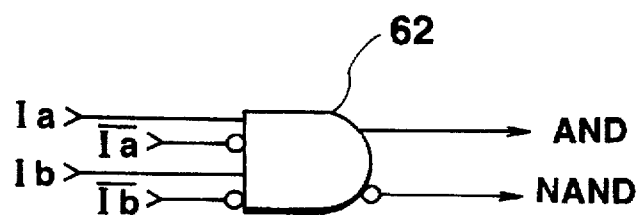
FIG. 23 shows a symbol representing the AND/NAND circuit shown in FIG. 22.
Figure 24A:
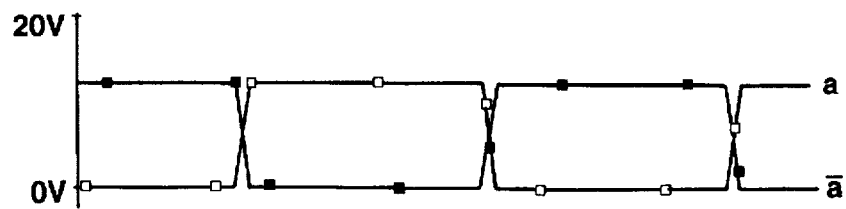
FIGS. 24A to 24C are timing charts for explaining the operation of the AND/NAND circuit shown in FIG. 23.
Figure 24B:
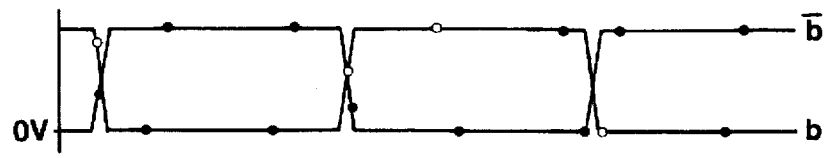
Figure 24C:
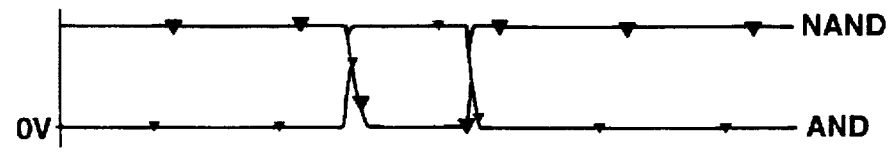

FIG. 23 shows a symbol representing the AND/NAND circuit 62 shown in FIG. 22. FIGS. 24A to 24C show the result of simulation of the output from the AND circuit and the NAND circuit for each pattern of input to the AND/NAND circuit 62 shown in FIG. 23.

As shown in FIGS. 24A to 24C, this AND/NAND circuit outputs AND and NOT of AND in accordance with the combination of input signals Ia and Ib and the inverted input signals ^Ia and ^Ib. The low level of a signal output from the logic circuit 55 is higher by the threshold voltage of the PMIS transistors Q31 to Q34 than the ground level VGND. However, the inverter basic circuits 52 and 53 correct the output level. That is, the inverter basic circuits 52 and 53 lower the low level of a signal output from them up to equal potential with the ground potential VGND.

Also, as the AND/NAND circuit 62 includes the inverter basic circuit shown in FIG. 1, there is little direct leak current and power consumption is reduced.

Figure 25:
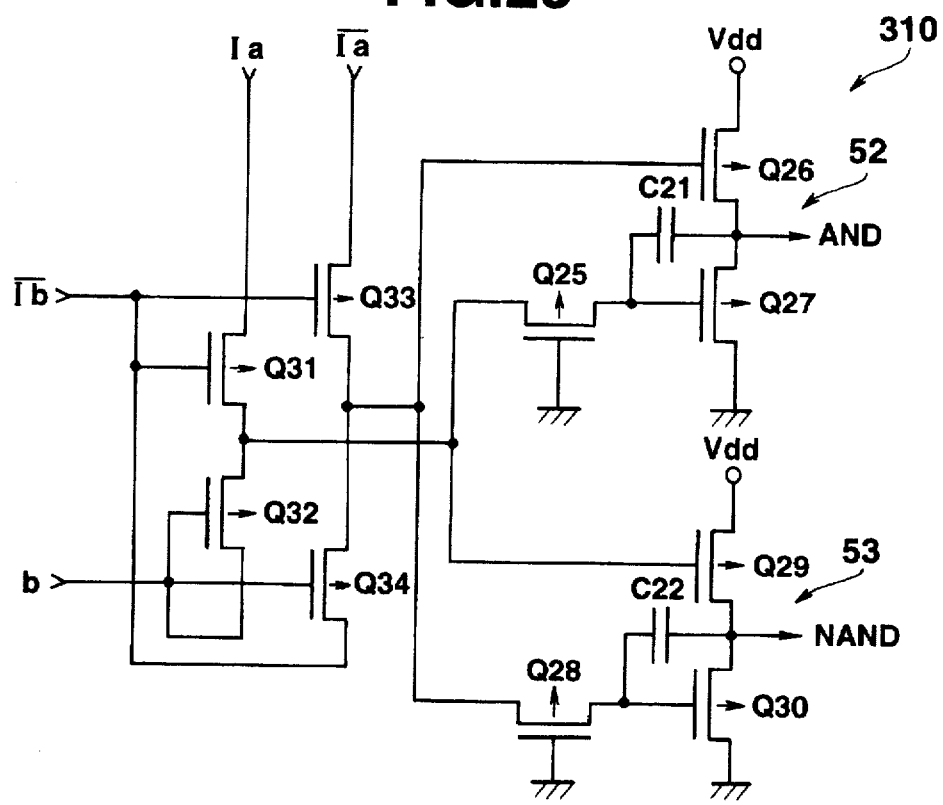
FIGS. 25 and 26 are circuit diagrams showing modified examples of the AND/NAND circuit shown in FIG. 22.
Figure 26:
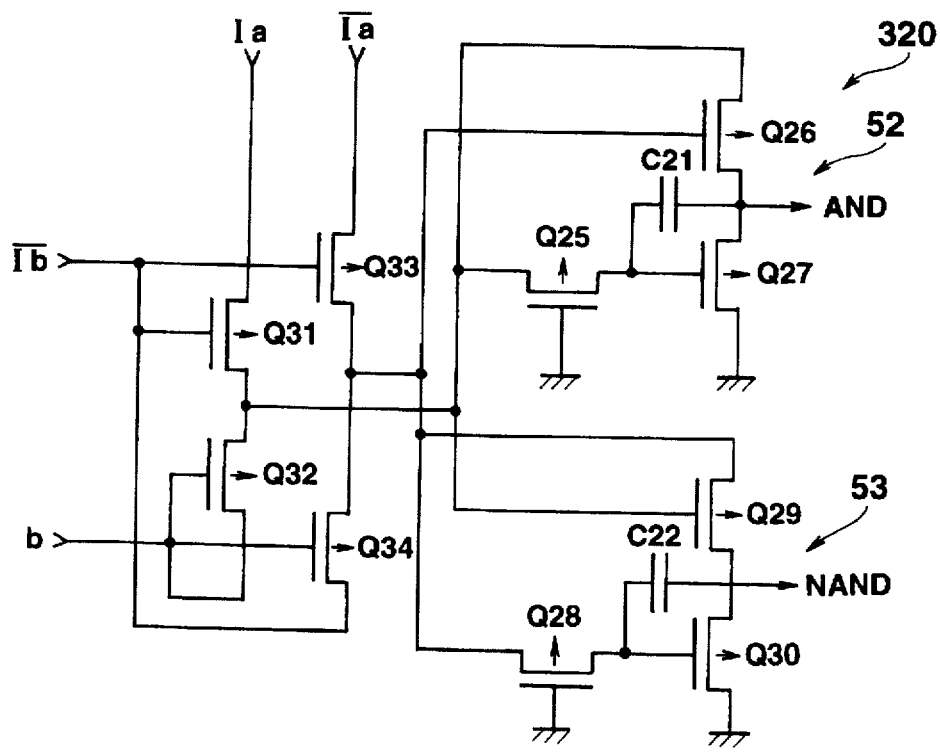
Figure 27:
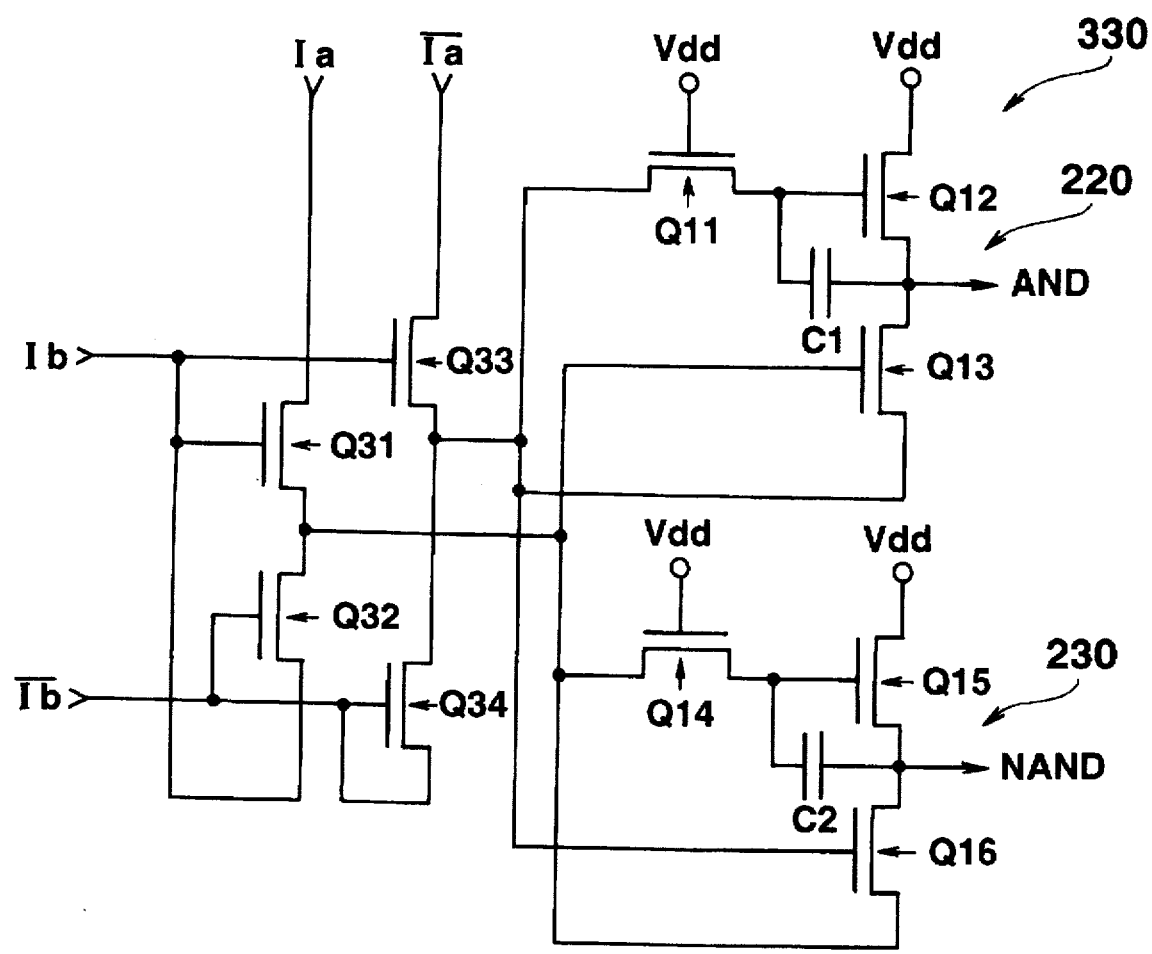
FIG. 27 is a circuit diagram showing the AND/NAND circuit constituted by an NMIS transistor.

FIGS. 25 to 27 show variations of the AND/NAND circuit 62 shown in FIG. 22.

The potential at the input terminal (drain) of the transistor Q32 in the logic circuit 55 shown in FIG. 22 is not required to be always at the low level and has only to be at the low level only when the transistor Q32 is turned on. Therefore, as shown in FIG. 25, an input signal Ib which is turned to the low level when the transistor Q32 is turned on may be applied to the input terminal of the transistor Q32. Similarly, the potential at the input terminal (drain) of the transistor Q34 is not required to be always at the high level and has only to be at the high level only when the transistor Q34 is mined on. Therefore, as shown in FIG. 25, an inverted input signal ^Ib which is turned to the high level when the transistor Q34 is turned on may be applied to the input terminal of the transistor Q34.

FIG. 26 shows another variation of the AND/NAND circuit shown in FIG. 22. The constitution of the former section of a circuit shown in FIG. 26, that is, the logic circuit is the same as that of the logic circuit shown in FIG. 25. However, the input terminal (source) of the PMIS transistor Q26 is connected to the output terminal (the junction of the transistors Q31 and Q32) of the logic circuit which is mined to the high level when the transistor Q26 is turned on.

The AND/NAND circuit 62, 310 and 320 respectively in FIG. 22, FIG. 25 and FIG. 26 are constituted by PMIS transistors, however, may be constituted by NMIS transistors.

FIG. 27 is a circuit diagram showing an AND/NAND circuit 330 constituted by NMIS transistors.

The AND/NAND circuit 330 shown in FIG. 27 is constituted by an inverter circuit consisting of inverter basic circuits 220 and 230 and a logic circuit connected to the former section of the inverter circuit and consisting of NMIS transistors Q31 to Q34.

This logic circuit is provided with the constitution in which PMIS transistors Q31 to Q34 in the logic circuit shown in FIG. 25 are replaced with NMIS transistors.

Also, the inverter basic circuits 220 and 230 are respectively provided with the same constitution as the inverter basic circuit shown in FIG. 14.

The constitution of the circuit shown in FIG. 27 can be also changed. For example, the input terminal (source) of the transistor Q13 is connected to the output terminal of the logic circuit 58 which is turned to the low level only when the transistor Q13 is turned on, however, it may be always grounded. Similarly, the input terminal (source) of the transistor Q16 may be always grounded.

The input terminal (source) of the transistors Q32 and Q34 may be also always grounded.

The other constitution of the circuit can be also changed.

5. OR circuit

FIG. 28 shows an OR/NOR circuit 64 for outputting the OR and the NOT (NOR) of PMIS transistors and FIG. 29 shows a symbol representing the OR/NOR circuit.

The OR/NOR circuit 64 comprises a logic circuit 56, and inverter circuits 52 and 53.

The constitution of the inverter basic circuits 52 and 53 is the same as that of the inverter basic circuits 52 and 53 constituting the latch circuit 51 shown in FIG. 17 or the AND/NAND circuit 62 shown in FIG. 22. The logic circuit 56 receives input signals Ia, ^Ia, Ib and ^Ib, outputs an ORed signal of the input signals Ia and Ib to a output terminal (connection point of transistors Q41 and Q42) and outputs a NORed signal of the input signals Ia and Ib to a output terminal (connection point of transistors Q43 and Q44).

The connection point of the transistors Q43 and Q44 in the logic circuit 56 is connected to the source of a transistor Q25 in the inverter basic circuit 52 and the gate of a transistor Q29 in the inverter basic circuit 53. The connection point of the transistors Q41 and Q42 in the logic circuit 56 is connected to the gate of a transistor Q26 in the inverter basic circuit 52 and the source of a transistor Q28 in the inverter basic circuit 53.

The OR/NOR circuit 64 constituted as described above can output a signal at the low level the potential of which is approximately equal to that of the ground.

The inverter basic circuits 52 and 53 constituting the OR/NOR circuit 64 can be transformed as shown in FIGS. 6 to 9. The OR/NOR circuit 64 can be also constituted by NMIS transistors.

6. EXCLUSIVE-OR circuit

FIG. 30 shows an EXOR/EXNOR circuit for outputting the exclusive-OR of input signals and the NOT of the exclusive-OR and FIG. 31 shows a symbol representing the EXOR/EXNOR circuit.

The EXOR/EXNOR circuit 65 shown in FIG. 30 is provided with inverter basic circuits 52 and 53 shown in FIGS. 22 and 28. The EXOR/EXNOR circuit 65 is different from the above-described AND/NAND circuit 62 and OR/NOR circuit 64 only in the logic circuit 57. The logic circuit 57 is provided with four PMIS transistors Q45 to Q48.

An input signal Ia is applied to the gate of the transistors Q47 and Q48. The inverted input signal ^Ia is applied to the gate of the transistors Q45 and Q46. An input signal Ib is applied to the source of the transistors Q46 and Q48. The inverted input signal ^Ib is applied to the source of the transistors Q45 and Q47. The drain of the transistors Q48 and Q45 is connected to the source of a transistor Q25 included in the inverter basic circuit 52 and the gate of a transistor Q29 included in the inverter basic circuit 53.

The drain of the transistors Q46 and Q47 is connected to the gate of a transistor Q26 included in the inverter basic circuit 52 and the source of a transistor Q28 included in the inverter basic circuit 53.

The EXOR/EXNOR circuit 65 constituted as described above can output a signal at the low level the potential of which is approximately equal to the ground potential VGND. The inverter basic circuits 52 and 53 constituting the EXOR/EXNOR, circuit 65 can be transformed as shown in FIGS. 6 to 9. The circuits can be also constituted by NMIS transistors.

7. Tristate circuit

Figure 32:
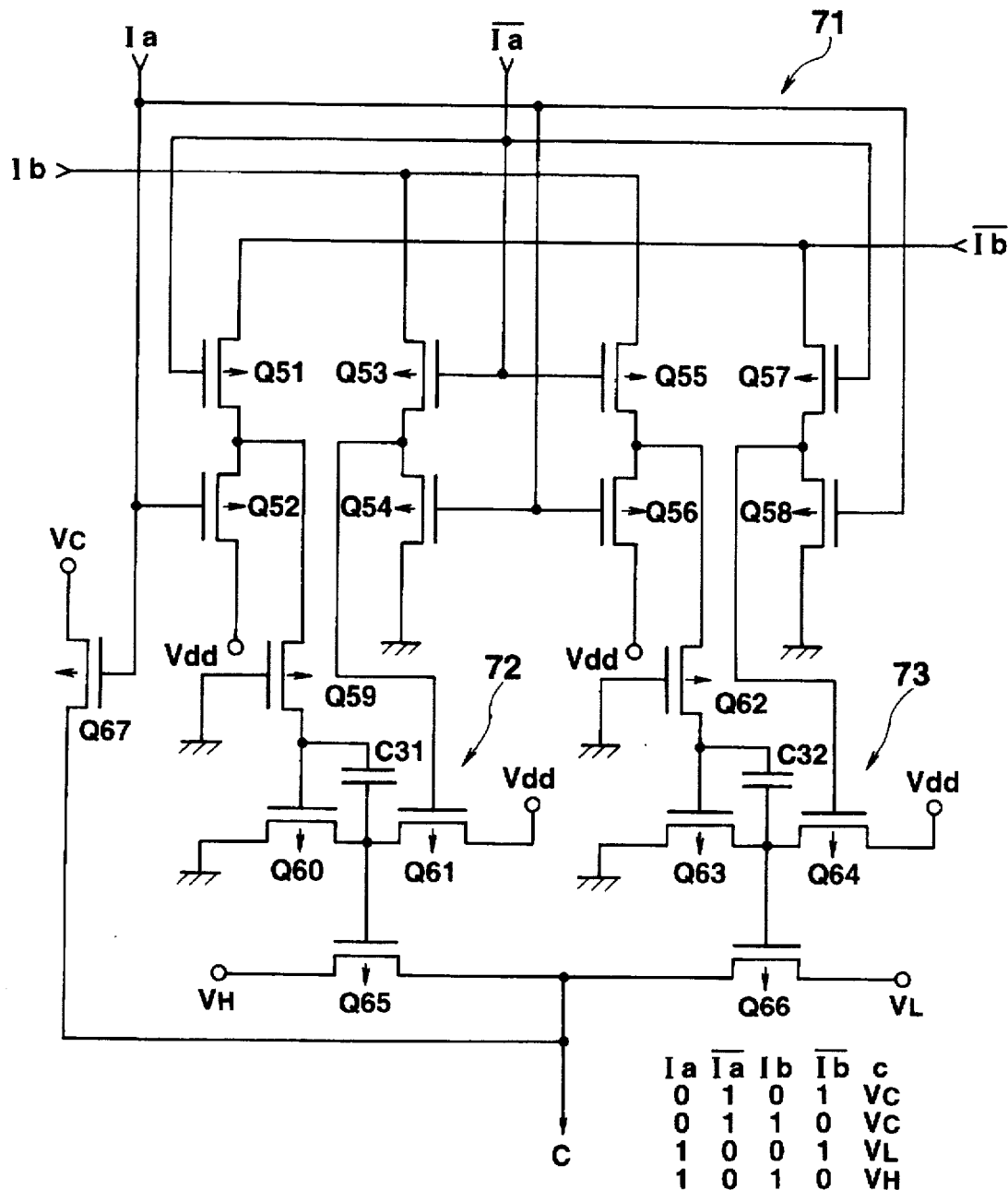
FIG. 32 is a circuit diagram of a tristate circuit for generating alternating voltage.

FIG. 32 shows the constitution of a tristate circuit 71 for generating AC voltage based upon DC voltage. The tristate circuit 71 is used, for example for generating an AC driving voltage because liquid crystal is deteriorated if liquid crystal is applied with a DC voltage to drive a liquid crystal display element.

First, referring to FIG. 32, the constitution of the tristate circuit will be described.

As shown in FIG. 32, eight PMIS transistors Q51 to Q58 constitute a logic device for generating a predetermined logic based upon an input signal Ia, the inverted input signal ^Ia, an input signal Ib and the inverted input signal ^Ib.

Current paths of the transistors Q51 and Q52 are cascaded. The source of the transistor Q52 is connected to the power source Vdd and an inverted input signal ^Ib is applied to the drain of the transistor Q51. Current paths of the transistors Q53 and Q54 are cascaded. The source of the transistor Q54 is grounded and an input signal Ib is applied to the drain of the transistor Q53.

Current paths of the transistors Q55 and Q56 are cascaded, the source of the transistor Q56 is connected to the power source Vdd and an input signal Ib is applied to the drain of the transistor Q55. Current paths of the transistors Q57 and Q58 are cascaded, the drain of the transistor Q54 is grounded and an inverted input signal ^Ib is applied to the source of the transistor Q57.

A signals at a connection point of transistors Q51 and Q52 and a signals at a connection point of transistors Q53 and Q54 are supplied to inverter basic circuit 72 constituted by PMIS transistors. Signals at a connection point of transistors Q55 and Q56 and a connection point of transistors Q57 and Q58 are supplied to inverter basic circuit 73 constituted by PMIS transistors. The inverter basic circuits 72 and 73 compensate a signal output from a logic circuit constituted by transistors Q51 to Q58 so as to obtain suitable output voltage by sufficiently driving the transistors Q65 and Q66 for actually outputting driving voltages.

For the output terminal of the inverter basic circuit 72, voltage VH is applied to the source of the PMIS transistor Q65 and the drain of the PMIS transistor Q65 is connected to the output terminal C of this tristate circuit 71. For the output terminal of the inverter basic circuit 73, the source of the PMIS transistor Q66 is connected to the output terminal C and voltage VL is applied to the drain of the PMIS transistor Q66. The transistors Q65 and Q66 are switching transistors.

The source of the PMIS transistor Q67 is supplied with an intermediate voltage VC, the drain of it is connected to output terminal C, and the gate of is supplied with a input signal Ia.

In the tristate circuit 71, one of transistors Q65 to Q67 turns on in accordance with input signals Ia and Ib and the inverted input signals ^Ia and ^Ib, and outputs one of voltage VH, VC and VL (VH>VC>VL) to the output terminal C. Therefore, the AC voltage is outputted from the output terminal C. In this circuit, a bus transistor logic is used as in the above-described AND/NAND circuit.

If this tristate circuit is used in a liquid crystal driver, a signal representing whether data to be written exists or not, that is, whether liquid crystal is to be driven or not is used as an input signal Ia, and a signal representing the polarity of liquid crystal driving voltage, that is, whether straight polarity or not is used as an input signal Ib.

Figure 33:
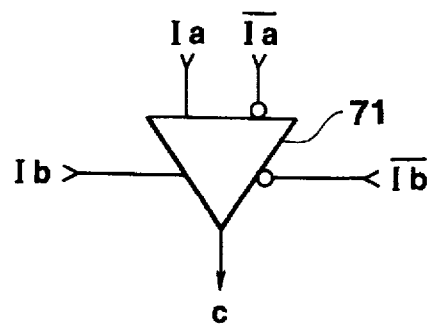
FIG. 33 shows a symbol representing the tristate circuit shown in FIG. 32.
Figure 34A:
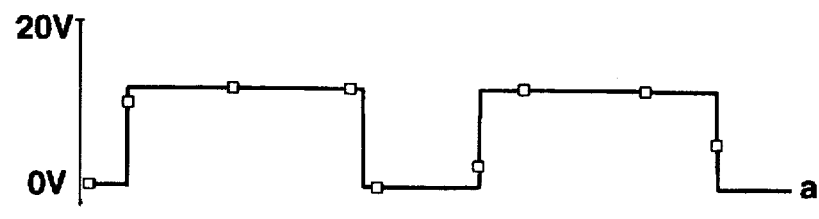
FIGS. 34A to 34C are timing charts for explaining the operation of the tristate circuit shown in FIG. 33.
Figure 34B:
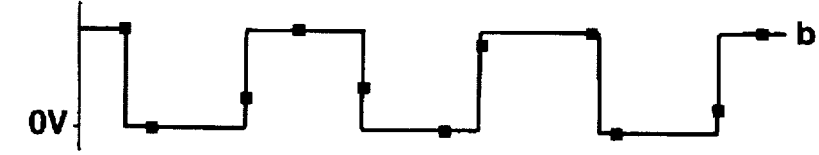
Figure 34C:
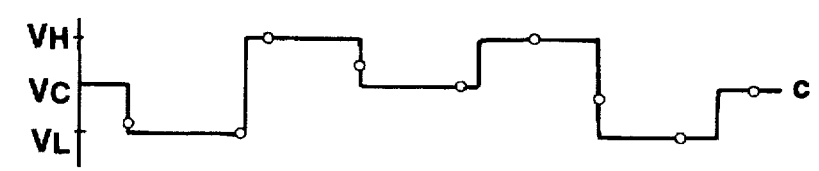

FIG. 33 shows a symbol representing the tristate circuit 71 shown in FIG. 32. FIGS. 34A to 34C show the result of simulation of the operation of the tristate circuit.

Next, the operation of the tristate circuit 71 will be described with reference to FIGS. 34A to 34C.

The tristate circuit 71 outputs any of voltage VH, VC and VL from an output terminal C according to input signals Ia and Ib and their inverted signals ^Ia and ^Ib, resulting in an AC output signal.

First, if input signals Ia and Ib are both at the level of "0" or the input signal Ia is at the level of "0" and the input signal Ib is at the level of "1", the transistors Q65 and Q66 are turned off and the transistor Q67 is mined on. Therefore, intermediate voltage Vc is outputted from the output terminal C.

If an input signal Ia is at the level of "1", the transistors Q52, Q54, Q56, Q58 and Q67 are turned off and the transistors Q51, Q53, Q55 and Q57 are turned on. Therefore, voltage output from the output terminal C is varied according to an input signal Ib.

If an input signal Ib is at the level of "0", the transistors Q61 and Q63 are turned on, power supply potential Vdd is applied to the gate of the transistor Q65 and ground potential VGND is supplied to the gate of the transistor Q66. Therefore, the transistor Q66 is mined on and the transistor Q65 is mined off. Therefore, low voltage VL is outputted from the output terminal C.

If an input signal Ib is at the level of "1", the transistors Q60 and Q64 are turned on, power supply potential Vdd is applied to the gate of the transistor Q66 and ground potential VGND is supplied to the gate of the transistor Q65. Therefore, the transistor Q66 is mined on and the transistor Q65 is turned off. Therefore, high voltage VH is outputted from the output terminal C.

The tristate circuit 71 is constituted by only PMIS transistors and capacitors, the constitution is simple, the circuit can be manufactured in a few processes and the manufacturing cost is low.

The tristate circuit 71 also compensates the output from a logic device in which inverter basic circuits 72 and 73 are constituted by transistors Q51 to Q58. Therefore, as shown in FIG. 34C, a signal at the low level which is lowered up to predetermined voltage can be outputted and a problem that output voltage VL at the low level cannot be lowered sufficiently is solved.

Figure 35:
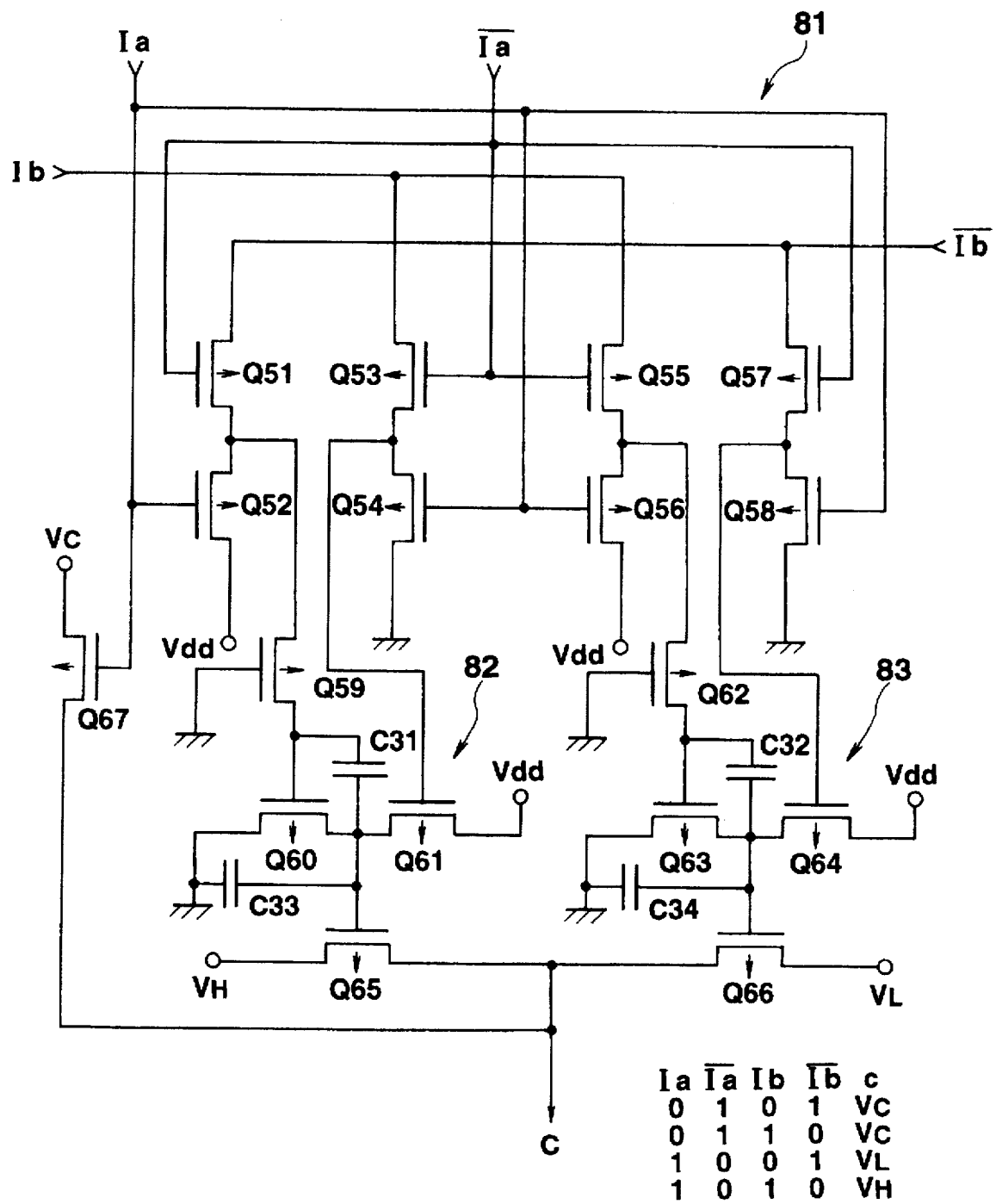
FIGS. 35 and 36 are circuit diagrams of a modified examples of the tristate circuit shown in FIG. 32.

However, in the case of the tristate circuit 71 shown in FIG. 32, the gate voltage of the transistors Q65 and Q66 may not be lowered to the ground level. This means that voltage output from the switching transistors Q65 and Q66 does not reach VH or VL. FIG. 35 shows a tristate circuit 81 wherein output voltage can be turned precisely to VH or VL. The tristate circuit 81 is provided with inverter basic circuits 82 and 83, one end of a capacitor C33 is connected to the gate of the switching transistor Q65 connected to the inverter basic circuit 82 and one end of a capacitor C34 is connected to the gate of the switching transistor Q66 connected to the inverter basic circuit 83. The other end of the capacitors C33 and C34 is respectively connected to ground potential VGND. The capacitors C33 and C34 respectively lower the gate voltage of the transistors Q65 and Q66 up to the ground potential VGND when the switching transistors Q65 and Q66 are turned on.

Figure 36:
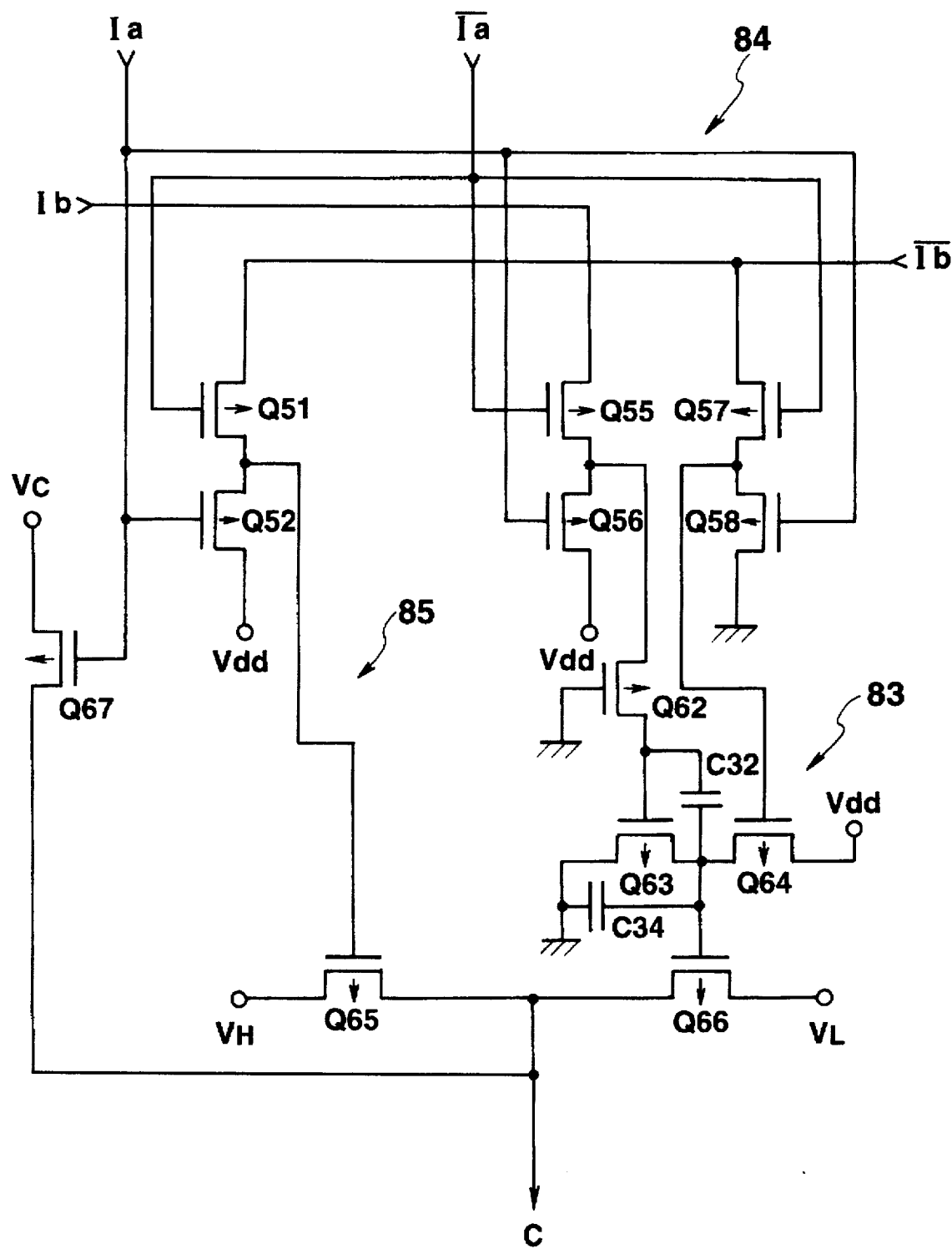

FIG. 36 shows an example in which the tristate circuit shown in FIG. 35 is transformed and the same reference numbers are allocated to the same section or the section equivalent to it shown in FIG. 35.

For example, in the case of a tristate circuit used in a liquid crystal driving circuit, even if the switching transistor Q65 for outputting voltage VH (>VL) at the high level is not turned on sufficiently, practically it may be sufficient. However, it is a problem that the transistor Q66 for generating voltage VL at the low level is not turned on sufficiently and the voltage VL at the low level is not lowered sufficiently.

In such a condition, the removal of the inverter basic circuit 82 shown in FIG. 35 provided to compensate the level of the voltage at the gate of the switching transistor Q65 for outputting voltage VH at the high level may be considered. FIG. 36 shows a tristate circuit 84 constituted based upon such thought.

In FIG. 36, an inverter circuit 85 connected to the gate of the switching transistor Q65 is not provided with an output voltage compensating circuit. An inverter basic circuit 83 connected to the gate of the switching transistor Q66 for generating voltage VL at the low level is the same as that shown in FIG. 35.

As the tristate circuit shown in FIG. 36 is constituted according to the purpose of use, the circuit has no bad effect upon practical characteristics differently from the tristate circuit 81 shown in FIG. 35 and further, five transistors Q53, Q54, Q59, Q60 and Q61 and two capacitors C31 and C33 can be removed. Therefore, the constitution of the circuit is simplified and the cost of the circuit can be reduced.

The tristate circuits 71, 81 and 84 are respectively constituted by PMIS transistors, however, they may be respectively constituted by NMIS transistors in place of PMIS transistors.

8. Liquid crystal driving circuit

Figure 37:
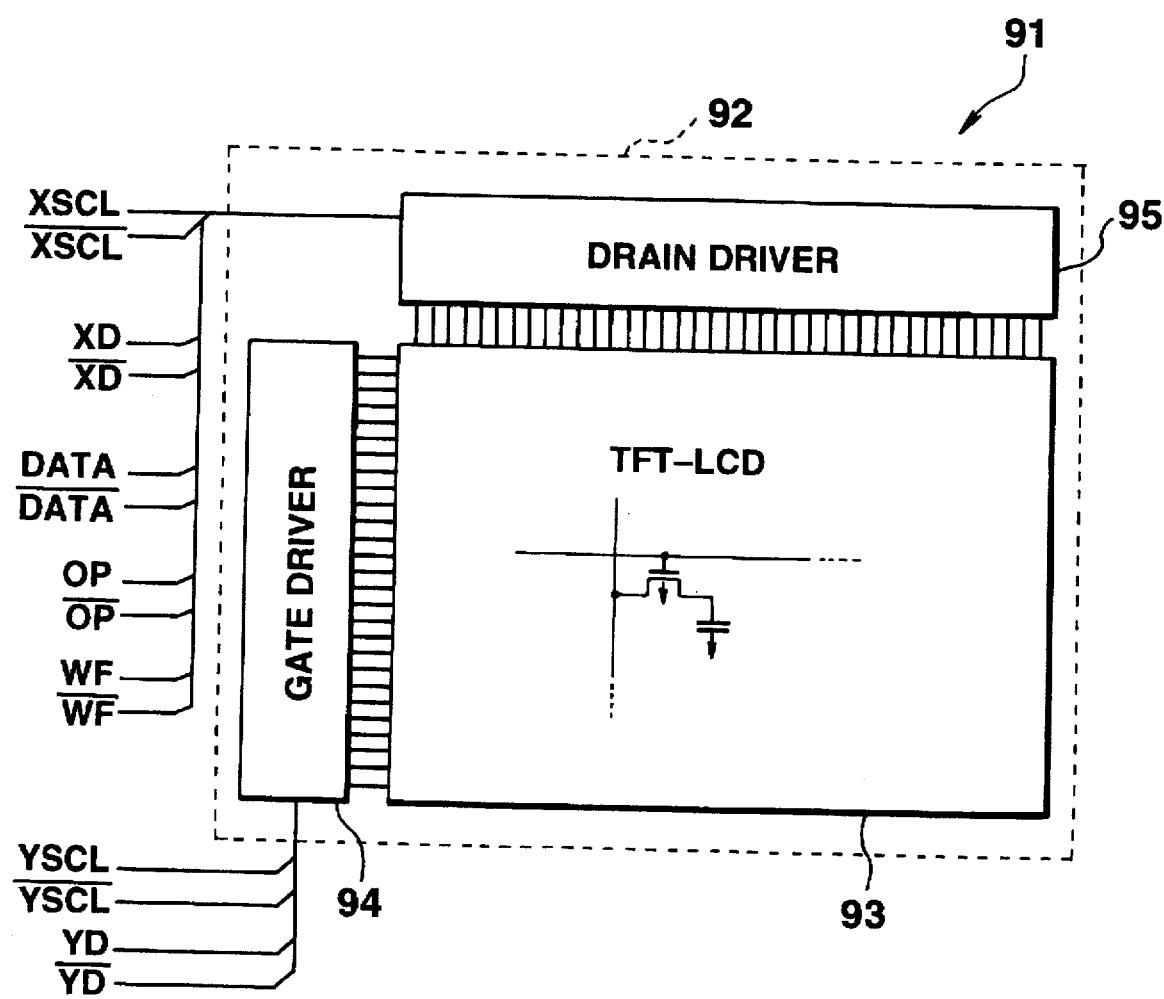
FIG. 37 is a schematic block diagram showing TFT-LCD to which a driving circuit is integrated.

FIG. 37 is a schematic block diagram showing a TFT-LCD 91 integrated with a driving circuit according to an embodiment of the present invention. In TFT-LCD 91, a thin film transistor (TFT) functioning as a switching element is formed in every pixel on a glass substrate in a display area of a liquid crystal display (LCD). In a non-display area, a liquid crystal driving circuit such as a drain driver (a data circuit driving circuit) and a gate driver (a scanning line driving circuit) is formed on a glass substrate.

First, the constitution of TFT-LCD will be described.

As shown in FIG. 37, the integrated driving circuit TFT-LCD 91 comprises a liquid crystal display panel (TFT-LCD) 93 in which a TFT is formed every pixel in a display area, a gate driver 94 for generating a selected state or an unselected state by applying a scanning signal to the gate of each TFT in the liquid crystal display panel 93 and a drain driver 95 for driving liquid crystal every pixel by applying a display signal to a TFT which is turned to a selected state by the gate driver 94.

TFTs, the gate driver 94 and the drain driver 95 are integrated on a glass substrate 92.

Figure 38:
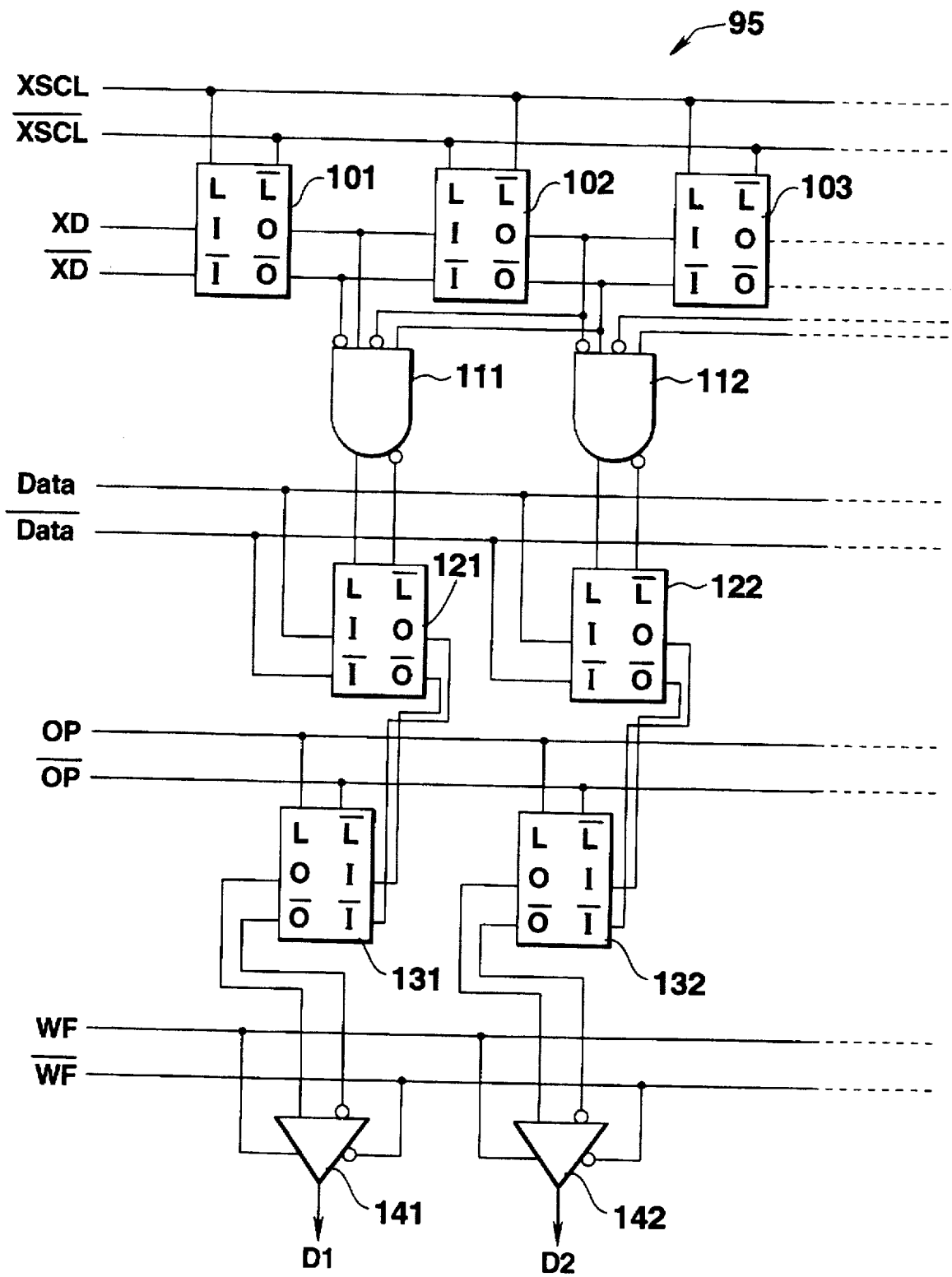
FIG. 38 is a circuit diagram of the drain driver shown in FIG. 37, constituted by a latch circuit including the basic circuit and a PMIS transistor, an AND circuit and a tristate circuit.

FIG. 38 is a circuit diagram showing the drain driver 95 shown in FIG. 37 comprising a latch circuit including an inverter basic circuit and PMIS transistors, an AND circuit and a tristate circuit.

FIGS. 39A to F are timing charts showing a signal waveform of each section shown in FIG. 38. The drain driver 95 shown in FIG. 38 is constituted by latch circuits 101, 102, 103, etc., AND circuits 111, 112, etc., latch circuits 121, 122, etc., latch circuits 131, 132, etc. and tristate circuits 141, 142, etc.

A horizontal clock XSCL shown in FIG. 39A and the inverted horizontal clock ^XSCL supplied by a controller not shown and 180° out of phase are alternately input to each control signal input terminal L and each inverted control signal input terminal ^L of latch circuits 101, 102 and 103. When a signal at the level of "1" is input to each control signal input terminal L of the latch circuits 101, 102 and 103, the latch circuits 101, 102, and 103 output the input signal I and the inverted input signal ^I as they are. When a signal at the level of "0" is input, the latch circuits 101, 102, and 103 latch the precedent input signals.

A horizontal synchronizing signal XD shown in FIG. 39B and the inverted signal ^XD are input to the input terminals I and ^I of the latch 101 and an output signal according to a through-state or a latch-state is outputted from an output terminal Q and the inverted output terminal ^Q.

A signal output from the latch circuit 101 is supplied to each input terminal of the AND circuit 111 and the next latch circuit 102.

Similarly, a signal output from the latch circuit 102 is supplied to each input terminal of the AND circuits 111 and 112 and the next latch circuit 103.

The AND circuit 111 receives a signal output from the latch circuits 101 and 102 and the inverted signals and supplies AND of a signal output from the latch circuit 101 and an inverted output signal output from the latch circuit 102 and the NOT to the control signal input terminal L and the inverted control signal input terminal ^L of the latch circuit 121. The AND circuit 112 supplies AND of an inverted output signal output from the latch circuit 102 and a signal output from the latch circuit 103 and the NOT to the control signal input terminal L and the inverted control signal input terminal ^L of the latch circuit 122.

The latch circuits 121 and 122 latch the data of each pixel input from a data conversion circuit not shown according to a signal output from the AND circuits 111 and 112. The latch circuits 121 and 122 respectively output the latched data to the next latch circuits 131 and 132. The latch circuits 131 and 132 latch the data of each pixel supplied as shown in FIG. 39D at the timing of the rise of a clock OP shown in FIG. 39C and the latched data is outputted to the tristate circuits 141 and 142.

The tristate circuits 141 and 142 respectively output an AC display signal by selecting any of supply voltage VH, VC and VL as shown in FIG. 39F according to a signal output from latch circuits 131 and 132 and an alternating signal WF shown in FIG. 39E. An AC display signal output from the tristate circuit 141 is outputted to a drain line D1 and an ac display signal output from the tristate circuit 142 is outputted to a drain line D2.

FIG. 38 explains only a part of the constitution of the drain driver 95 for supplying to two drain lines. Actually, each circuit described above is arranged in a row by the number of pixels in the horizontal scanning direction. By this, a display signal according to the position can be supplied to each drain line.

The above-described drain driver 95 can be constituted by only an inverter basic circuit and PMIS transistors. Therefore, the structure of a transistor is simpler and the number of manufacturing processes can be reduced, compared with a drain driver constituted by CMIS transistors. Further, if a PMIS transistor is used as a TFT for each pixel, an integrated driving circuit TFT-LCD can be simultaneously manufactured on the same plane of a glass substrate and the manufacturing cost can be reduced.

The drain driver 95 has little direct leak current as a drain driver formed by a CMIS circuit, consumes little power and a suitable output level, particularly the output at the low level can be kept low enough.

Figure 40:
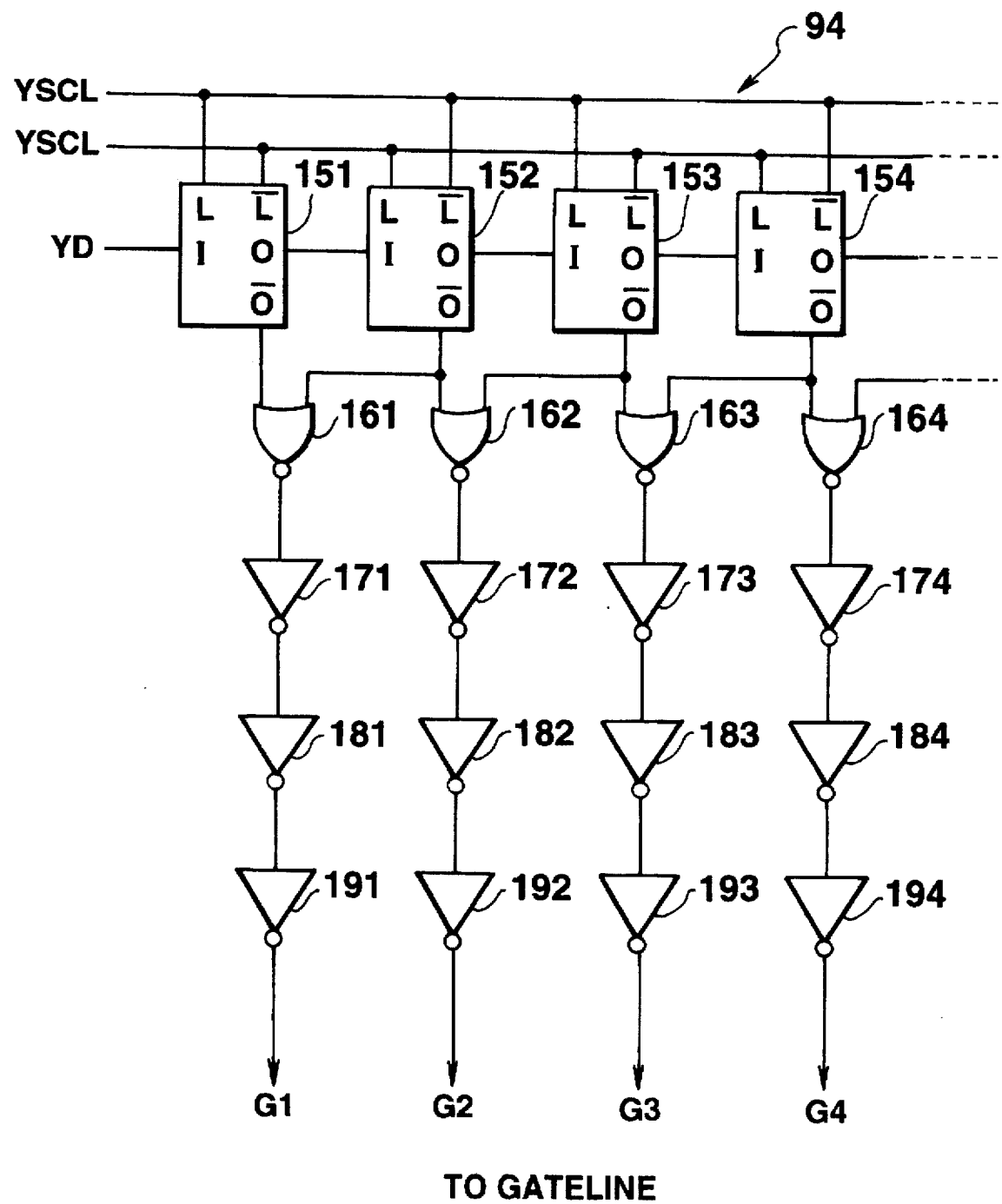
FIG. 40 is a circuit diagram showing the gate driver shown in FIG. 37 constituted by a latch circuit including the basic circuit and a PMIS transistor, an AND circuit and an inverter circuit.

FIG. 40 is a detailed block diagram showing the gate driver 94 shown in FIG. 37. The gate driver 94 comprises latch circuits 151, 152, etc., NOR circuits 161, 162, etc., inverter circuits 171, 172, etc., inverter circuits 181, 182, etc. and inverter circuits 191, 192, etc.

A vertical clock YSCL from a controller not shown is alternately input to the control terminal L and the inverted control terminal ^L of each latch circuit 151, 152, etc. connected in a column. An inverted vertical clock ^YSCL from the controller not shown is alternately input to the inverted control terminal ^L and the control terminal L of each latch circuit 151, 152, etc. connected in a column. In other words, an inverted vertical clock is supplied to a control terminal L or an inverted control terminal ^L to which a vertical clock YSCL is not supplied. The latch circuits 151, 152, etc. output the input signals as thy are when a signal at the level of "1" is input to each control terminal L and latch the precedent input signals when a signal at the level of "0" is input.

A vertical synchronizing signal YD is supplied to the input terminal I of the latch 151. A vertical synchronizing signal YD is output in order from the output terminal Q of the latch circuits 151, 152, etc. to the next latch circuits 152, 153, etc. in synchronization with a vertical clock YSCL and the inverted vertical clock ^YSCL. A signal from each inverted output terminal ^Q of the latch circuits 151, 152, 153, etc. is output to one input terminal of the corresponding NOR circuits 161, 162, etc. and the other input terminal of the precedent NOR circuits 161, 162, etc.

A signal output from the NOR circuits 161, 162, etc. is supplied to the inverter circuits 171, 172, etc., increases current through the corresponding inverter circuits 181, 182, etc. and the corresponding inverter circuits 191, 192, etc. and is output to each gate line as a gate signal G1, G2, etc.

FIGS. 41A to 41F show timing of a vertical clock YSCL, the inverted vertical dock ^YSCL, a vertical synchronizing signal YD and gate signals G1, G2, etc. The gate driver 94 can be constituted by only PMIS transistors by using the inverter basic circuit according to the present invention as the drain driver 95. Therefore, the structure of a circuit is simpler and the number of manufacturing processes can be reduced, compared with a gate driver constituted by CMIS transistors. Particularly, as an integrated driving circuit TFT-LCD can be formed on the same plane of a glass substrate if a PMIS transistor is used as a TFT for each pixel, the manufacturing cost can be reduced.

The gate driver 94 is provided with a characteristic of low power consumption as L 0 a CMIS circuit and a suitable output level.

9. Manufacturing process of a thin film transistor

FIGS. 42A to 42J are sectional views showing TFTs to explain the manufacturing process of the integrated driving circuit TFT-LCD 91 shown in FIG. 37. This TFT-LCD 91 is provided with multigate structure provided with a plurality of gates for at least a thin film transistor for a pixel.

The characteristics of this manufacturing process are that the number of processes in which impurities are doped is small, compared with the manufacturing process of a CMIS circuit because the driver circuit is constituted by the same conductive type of thin film transistors and that the costs can be reduced because the number of masks required for the processes in which impurities are doped is also small. Particularly, the pressure resistance of a source/drain (S/D) is satisfactory and leak current is reduced by adopting a thin film transistor with multigate structure for a pixel in a liquid crystal display.

Figure 42A:
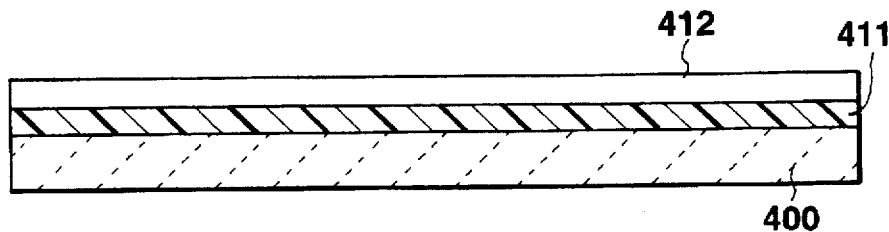
FIGS. 42A to 42J are sectional views to explain the manufacturing process of a TFT-LCD shown in FIG. 37.

First, as shown in FIG. 42A, after a glass substrate 400 is cleaned, a silicon oxide film approximately 1000 Å thick is formed as a transparent insulating film 411 using a sputtering device. An insulating film is not limited to a silicon oxide film and a film other than it may be used.

An amorphous silicon film 412 approximately 500/1, thick is further formed using a plasma-assisted CVD device on the insulating film 411 consisting of a silicon oxide film.

Figure 42B:
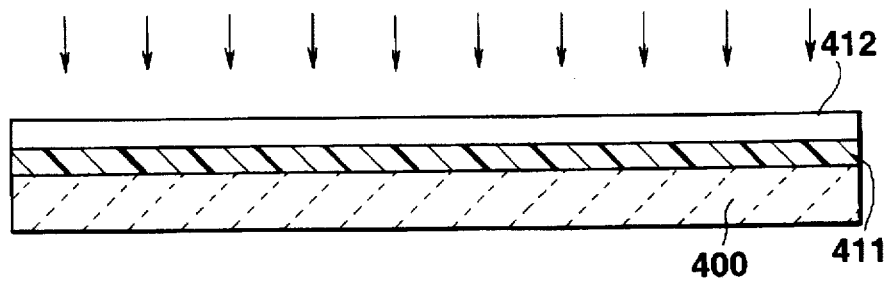

Next, the amorphous silicon film 412 shown in FIG. 42A is left in a nitric atmosphere at 450° C. for two hours to dehydrate it. Next, as shown in FIG. 42B, the amorphous silicon film 412 is annealed by irradiating laser beams with the density of energy approximately 350 mJ/cm² twice in a vacuum using an excimer laser device to form polysilicon 412. A laser device, a condition under which laser beams are irradiated and laser annealing are not limited to the above-described, for example, a polysilicon layer may be formed using solid phase epitaxial growth.

Figure 42C:
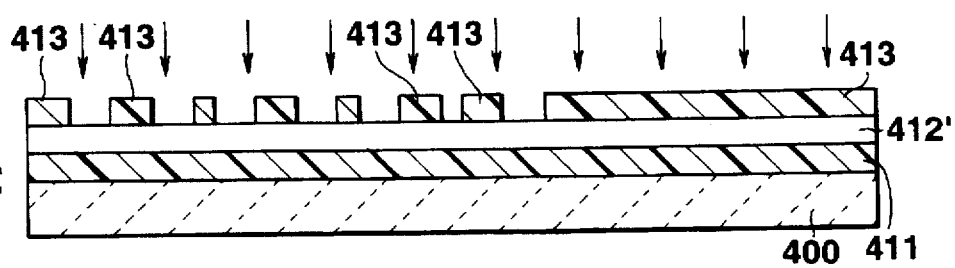

Next, as shown in FIG. 42C, photoresist (P.R.) is applied on the polysilicon film 412 and a photoresist mask 413 is formed by exposing it to UV via a patterning mask with a predetermined pattern. B₂H₆ diluted by 1% hydrogen and hydrogen gas are mixed in a flow ratio of 5/45 (ccm) using an ion implantation device not shown and impurities approximately 2×10¹⁵ (ion/cm²) are doped at accelerating energy 10 Ke V via the photoresist mask 413.

Figure 42D:
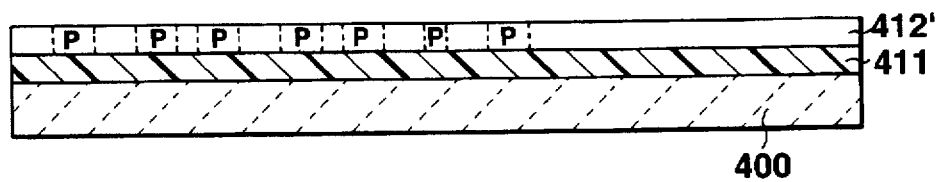

Next, as shown in FIG. 42D, atoms of impurities are activated by annealing the polysilicon layer 412 which is a semiconductor layer with laser beams and a P area in which the ratio of holes is high is selectively formed. The area in which impurities are not doped is an i-area which is an intrinsic semiconductor and the channel of a MIS transistor described later is formed.

Figure 42E:
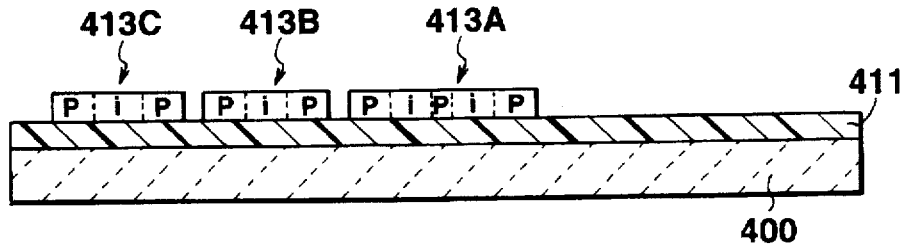

Next, as shown in FIG. 42E, an element respectively forming the source area, the channel area and the drain area of each MIS transistor by selectively etching the polysilicon film 412 is separated. In a device area 413A shown in FIG. 42E, two intrinsic semiconductor areas (i-areas) which will function as channel areas are formed among P areas and a TFT for a pixel with dual gate structure is formed. In device areas 413B and 413C, for example an inverter circuit in a driver circuit is constituted by connecting the source and the drain of two PMIS transistors in series.

Figure 42F:
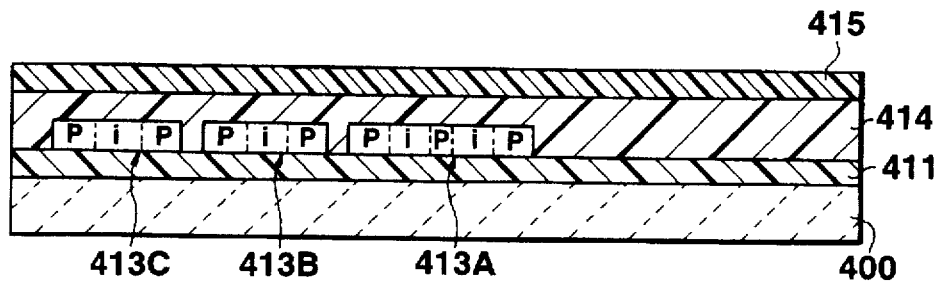

As shown in FIG. 42F, a silicon oxide film 414 and a silicon nitride film 415 respectively with predetermined thickness are formed as a gate insulating film on a semiconductor layer on which a device is separated.

Figure 42G:
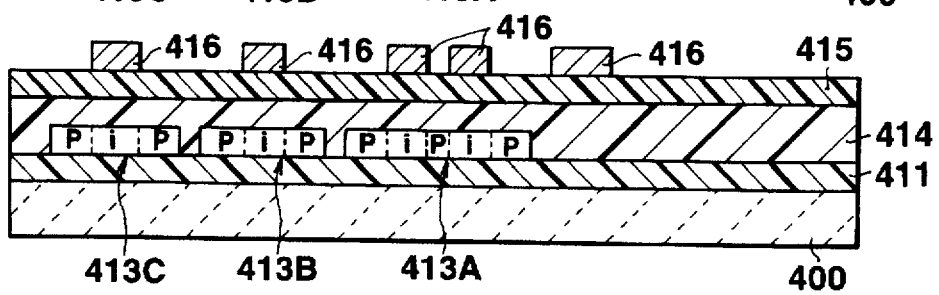

Next, a chromium film 416 with predetermined thickness is formed on the silicon nitride film 414. Next, as shown in FIG. 42G, the chromium film 416 is selectively etched to form a gate.

Figure 42H:
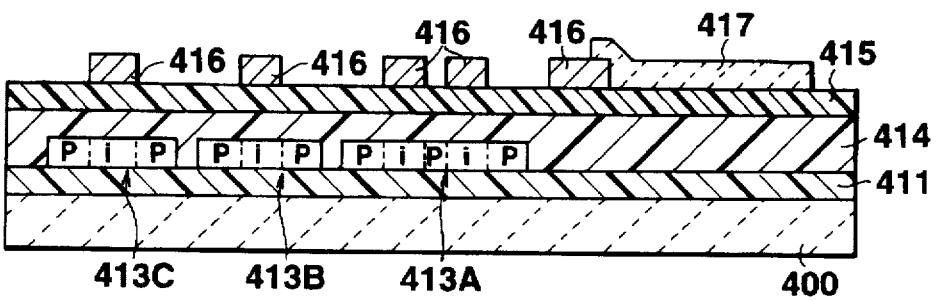
Figure 42:
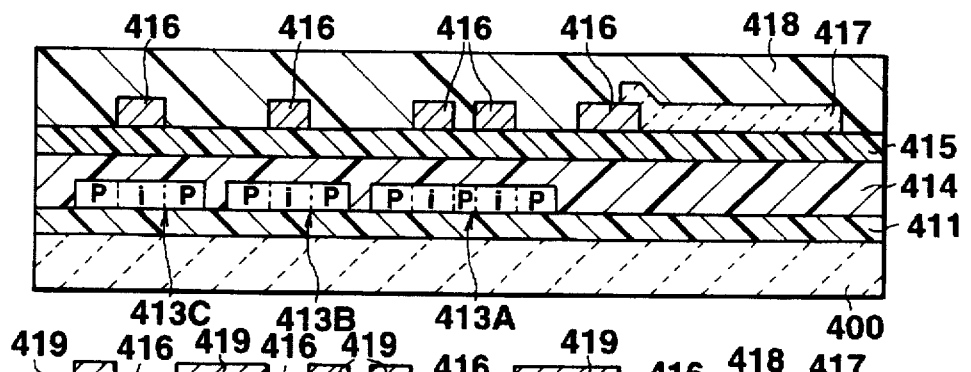

Next, an indium tin oxide (ITO) film with predetermined thickness is formed. Next, this ITO film is patterned and as shown in FIG. 42H, a pixel electrode 417 arranged in a matrix in a liquid crystal display panel is formed.

Figure 42J:
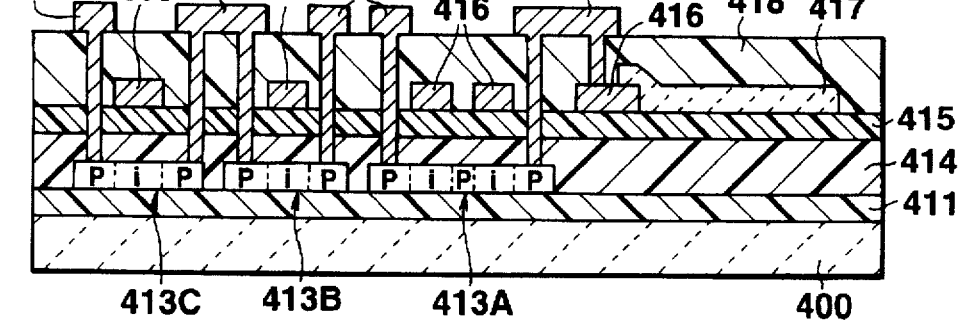

Next, as shown in FIG. 42I, a silicon nitride film 418 which will function as a layer insulating film is formed on the overall surface including a pixel electrode 417 consisting of ITO. Next, as shown in FIG. 42J, a contact hole for being in contact with the source area and the drain area of each PMIS transistor is formed by selectively etching the above-described layer insulating film 418 and gate insulating films 414 and 415. After an aluminum film is formed inside the contact hole and on the surface of the contact hole, the aluminum film is patterned in the predetermined shape and a source/drain (S/D) electrode 419 is formed.

By the above-described process, a liquid crystal driving circuit constituted by the same conductive type of PMIS transistors and a switching device every pixel are integrated on the glass substrate 400. Therefore, the frequency of ion implantation is smaller than the conventional liquid crystal driving circuit using a CMIS circuit, the number of masks used for ion implantation is also small and the manufacturing cost can be reduced.

As shown in FIG. 42J, a switching device in a pixel area is provided with dual gate structure in which the source and the drain of two PMIS transistors in the device area 413A are connected in series and the gate 416 of two PMIS transistors is respectively connected to a common gate line. Therefore, the pressure resistance of the source/drain (S/D) is high and leak current can be reduced.

Figure 43:
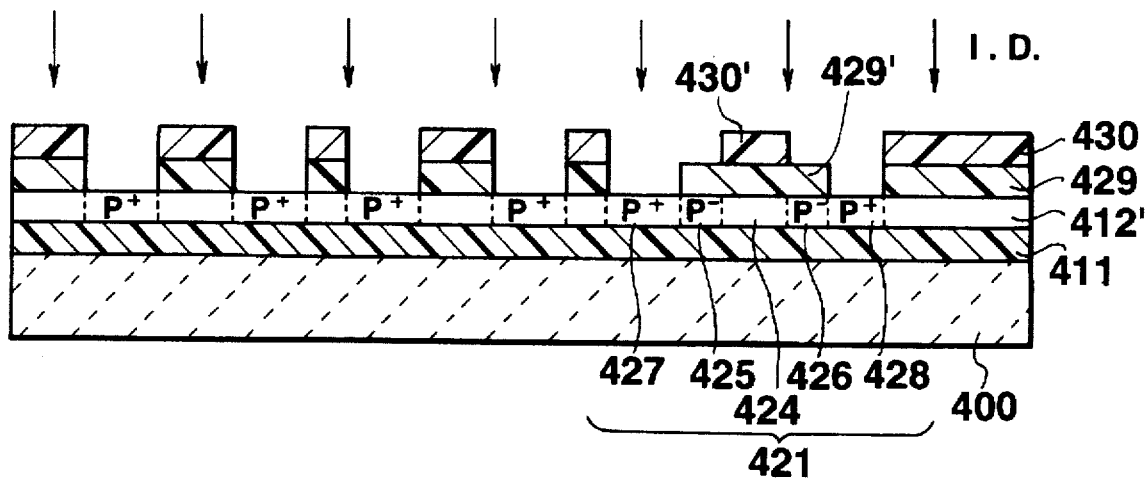
FIG. 43 is a sectional view showing a thin film semiconductor device to explain another manufacturing process.
Figure 44:
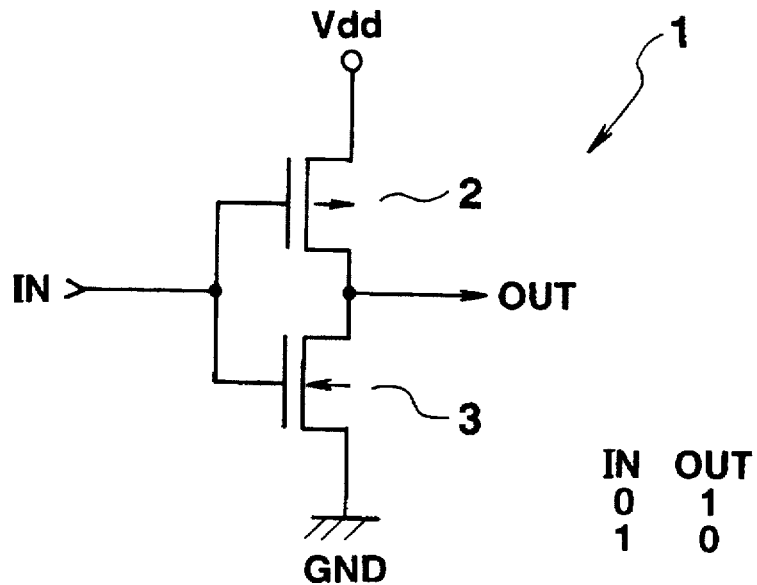
FIG. 44 shows a conventional CMIS inverter circuit.
Figure 45:
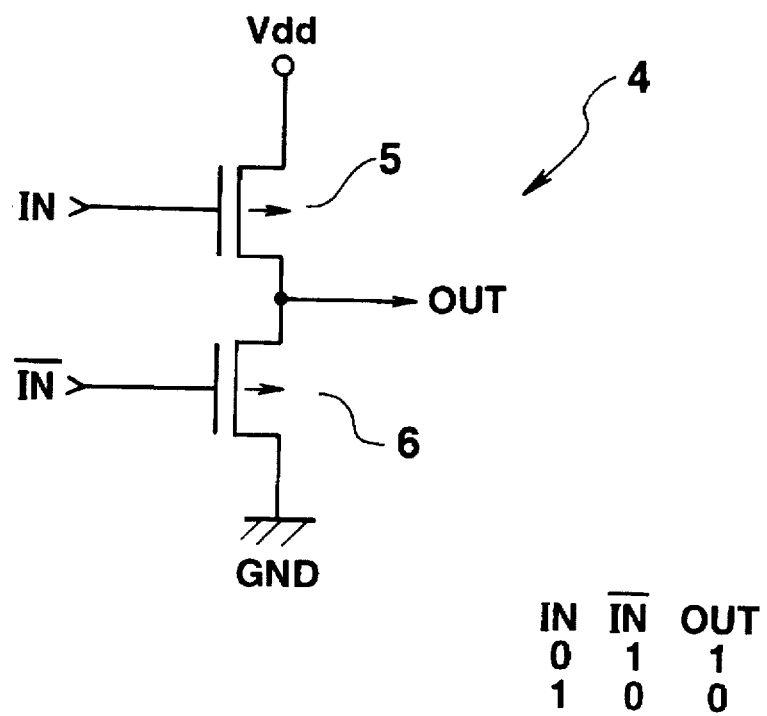
FIG. 45 shows a conventional non-ratio type inverter circuit.

FIG. 43 is a drawing to explain a process of ion implantation if the same conductive type of thin film transistor according to this embodiment is provided with LDD structure. In FIG. 43, a source area and a drain area 425 and 426 in contact with both ends of a channel area 429 and consisting of a low-density impurities diffused layer, and high-density impurities diffused layers 427 and 428 outside the source area and the drain area are formed in a TFT area 421 forming a switching device in a pixel area in place of dual gate structure described in relation to FIGS. 42A to 42J.

The manufacturing process at the precedent stage of FIG. 43 is shown in FIGS. 42A and 42B. That is, after the amorphous silicon film 412 is polymerized, for example a silicon oxide film 429 approximately 200 Å thick is provided between the polysilicon film 412 and photoresist 430 applied to the film and is selectively etched in the shape shown in FIG. 43.

In FIG. 43, the width of photoresist 430 is smaller than that of a silicon oxide film 429. Therefore, two types of masks different in the density of implanted ion can be formed. An intrinsic semiconductor (a channel area 424) into which impurities are not doped is formed under a thick mask, P⁻ areas 425 and 426 into which low density of impurities are doped are formed under a thin mask by doping impurities with energy 20 Ke V in FIG. 43, a P⁺ area 427 into which high density of impurities are doped is formed under no mask. Therefore, LDD structure can be formed in one process in which ion is implanted.

As described above, if LDD structure is adopted for a TFT in a pixel area shown in FIG. 43, there is an advantage that leak current can be reduced without increasing the frequency of ion implantation.

What is claimed is:

1. A semiconductor device comprising:
   first and third MIS transistors of a same conductive type,
     said first and third MIS transistors having respective input terminals to which a high potential Vdd is applied;
   second and fourth MIS transistors of the same conductive type as said first and third MIS transistors, said second and fourth MIS transistors having respective input terminals to which a low potential GND lower than said high potential Vdd is applied;

output means connected to output terminals of said first and second MIS transistors for outputting a first signal;

inverted output means connected to output terminals of said third and fourth MIS transistors for outputting a second signal having a different polarity than said first signal output from said output means;

non-inverted signal supply means connected to gates of said first and fourth MIS transistors for supplying a non-inverted signal;

inverted signal supply means connected to gates of said second and third MIS transistors for supplying an inverted signal;

a first output voltage compensating circuit arranged among said output terminals of said first and second MIS transistors and said inverted signal supply means;

a second output voltage compensating circuit arranged among said output terminals of said third and fourth MIS transistors and said non-inverted signal supply means;

an additional MIS transistor of the same conductive type as said first, second, third and fourth MIS transistors, said additional MIS transistor being connected between said non-inverted signal supply means and said inverted signal supply means; and a further MIS transistor of the same conductive type as said first, second, third and fourth MIS transistors, said further MIS transistor being connected between said inverted signal supply means and said output means.

2. A semiconductor device comprising:

first and third MIS transistors of a same conductive type, said first and third MIS transistors having respective input terminals to which a high potential Vdd is applied;

second and fourth MIS transistors of the same conductive type as said first and third MIS transistors, said second and fourth MIS transistors having respective input terminals to which a low potential GND lower than said high potential Vdd is applied;

inverted output means connected to output terminals of said first and second MIS transistors for outputting a first signal;

output means connected to output terminals of said third and fourth MIS transistors for outputting a second signal having a different polarity than said first signal output from said inverted output means;

non-inverted signal supply means connected to gates of said first and fourth MIS transistors for supplying a non-inverted signal;

inverted signal supply means connected to gates of said second and third MIS transistors for supplying an inverted signal;

a first output voltage compensating circuit arranged among said output terminals of said first and second MIS transistors and said non-inverted signal supply means; and a second output voltage compensating circuit arranged among said output terminals of said third and fourth MIS transistors and said inverted signal supply means, wherein said first output voltage compensating circuit comprises (i) a fifth MIS transistor of the same conductive type as said first, second, third and fourth MIS transistors, said fifth MIS transistor including an input terminal which is connected to said non-inverted signal supply means, and (ii) first capacitor means connected to an output terminal of said fifth MIS transistor and said output terminals of said first and second MIS transistors, wherein said second output voltage compensating circuit comprises (i) a sixth MIS transistor of the same conductive type as said first, second, third, and fourth MIS transistors, said sixth MIS transistor including an input terminal which is connected to said inverted signal supply means, and (ii) second capacitor connected to an output terminal of said sixth MIS transistor and said output terminals of said third and fourth MIS transistors, wherein said semiconductor device further comprises (i) a seventh MIS transistor of the same conductive type as said first, second, third and fourth MIS transistors, said seventh MIS transistor being connected between said non-inverted signal supply means and said inverted output means, and (ii) an eighth MIS transistor of the same conductive type as said first, second, third and fourth MIS transistors, said eighth MIS transistor being connected between said inverted signal supply means and said output means, and wherein said first, second, third, fourth, fifth, sixth, seventh and eighth MIS transistors are N type.

3. A semiconductor device comprising:

a first MIS transistor of a conductive type, said first MIS transistor having a first data terminal which receives a high potential Vdd;

a second MIS transistor of the same conductive type as said first MIS transistor, said second MIS transistor having a first data terminal which receives a low potential GND lower than said high potential Vdd;.

an output terminal coupled to second data terminals of said first and second MIS transistors;

a first input terminal connected to a gate of said first MIS transistor for supplying a non-inverted signal;

a second input terminal directly connected to a gate of one of said first and second MIS transistors for supplying an inverted signal, said inverted signal having a reverse polarity to said non-inverted signal and being synchronized with said non-inverted signal; and an output voltage compensating circuit connected between one of (i) said output terminal and said first input terminal and (ii) said output terminal and said second input terminal, wherein said output voltage compensating circuit includes a third MIS transistor of the same conductive type as said first and second MIS transistors, and a capacitor arranged between said third MIS transistor and said output terminal, and wherein said third MIS transistor has a gate which is supplied with one of the high potential Vdd received by said first data terminal of said first MIS transistor and the low potential GND received by said first data terminal of said second MIS transistor.

4. The semiconductor device according to claim 3, wherein said first, second and third MIS transistors are P type.

5. The semiconductor device according to claim 4, wherein said first data terminal of said first MIS transistor is connected to said second input terminal.

6. The semiconductor device according to claim 4, wherein said first data terminal of said second MIS transistor is connected to said second input terminal.

7. The semiconductor device according to claim 4, wherein said gate of said third MIS transistor is connected to said second input terminal.

8. The semiconductor device according to claim 3, wherein said first, second and third MIS transistors are N type.

9. The semiconductor device according to claim 8, wherein said first data terminal of said first MIS transistor is connected to said first input terminal.

10. The semiconductor device according to claim 8, wherein said first data terminal of said second MIS transistor is connected to said first input terminal.

11. The semiconductor device according to claim 8, wherein said gate of said third MIS transistor is connected to said first input terminal.

12. The semiconductor device according to claim 3, further comprising a fourth MIS transistor of the same conductive type as said first, second and third MIS transistors, and wherein said second data terminals of said first and second MIS transistors are respectively connected to a gate of said fourth MIS transistor.

13. The semiconductor device according to claim 12, further comprising a second capacitor arranged between said gate of said fourth MIS transistor and a ground.

14. A semiconductor device comprising:
 first and third MIS transistors of a same conductive type, said first and third MIS transistors having respective first data terminals to which a high potential Vdd is applied;
 second and fourth MIS transistors of the same conductive type as said first and third MIS transistors, said second and fourth MIS transistors having respective first data terminals to which a low potential GND lower than said high potential Vdd is applied;
 a first output terminal coupled to second data terminals of said first and second MIS transistors for outputting a first signal;
 a second output terminal coupled to second data terminals of said third and fourth MIS transistors for outputting a second signal having a reverse polarity to said first signal output by said first output terminal;
 a first input terminal coupled to gates of said first and fourth MIS transistors for supplying a non-inverted signal;
 a second input terminal coupled to gates of said second and third MIS transistors for supplying an inverted signal, said inverted signal having a reverse polarity to said non-inverted signal and being synchronized with said non-inverted signal;
 a first output voltage compensating circuit arranged among said second data terminals of said first and second MIS transistors and said second input terminal, and
 a second output voltage compensating circuit arranged among said second data terminals of said third and fourth MIS transistors and said first input terminal.

15. The semiconductor device according to claim 14, wherein said first output voltage compensating circuit comprises (i) a fifth MIS transistor of the same conductive type as said first, second, third and fourth MIS transistors, said fifth MIS transistor including a first data terminal which is connected to said second input terminal, and (ii) a first capacitor connected to a second data terminal of said fifth MIS transistor and said second data terminals of said first and second MIS transistors, wherein said second output voltage compensating circuit comprises (i) a sixth MIS transistor of the same conductive type as said first, second, third, and fourth MIS transistors, said sixth MIS transistor including a first data terminal which is connected to said first input terminal, and (ii) a second capacitor connected to a second data terminal of said sixth MIS transistor and said second data terminals of said third and fourth MIS transistors, and wherein said fifth and sixth MIS transistors have respective gates which are supplied with the low potential GND which is applied to said first data terminal of said second and fourth MIS transistors.

16. The semiconductor device according to claim 15, wherein said first, second, third and fourth MIS transistors are P type.

17. The semiconductor device according to claim 16, wherein said first data terminal of said second MIS transistor is connected to said second input terminal.

18. The semiconductor device according to claim 16, wherein said first data terminal of said first MIS transistor is connected to said second input terminal.

19. The semiconductor device according to claim 16, wherein said first data terminal of said fourth MIS transistor is connected to said first input terminal.

20. The semiconductor device according to claim 16, wherein said first data terminal of said third MIS transistor is connected to said first input terminal.

21. The semiconductor device according to claim 14, further comprising:
 an additional MIS transistor of the same conductive type as said first, second, third and fourth MIS transistors, said additional MIS transistor being connected between said first input terminal and said second input terminal; and
 a further MIS transistor of the same conductive type as said first, second, third and fourth MIS transistors, said further MIS transistor being connected between said second input terminal and said second output terminal.

22. The semiconductor device according to claim 14, further comprising a logic circuit which includes a plurality of still further MIS transistors of the same conductive type as said first, second, third and fourth MIS transistors.

23. The semiconductor device according to claim 22, wherein said logic circuit includes one of an AND circuit and a NAND circuit.

24. The semiconductor device according to claim 22, wherein said logic circuit includes one of an OR circuit and a NOR circuit.

25. The semiconductor device according to claim 22, wherein said logic circuit includes one of an EXOR circuit and a NEXOR circuit.

26. The semiconductor device according to claim 14, further comprising a yet still further MIS transistor of the same conductive type as said first, second, third and fourth MIS transistors, wherein a gate of said yet still further MIS transistor is connected to at least one of first and second output terminals.

27. The semiconductor device according to claim 26, further comprising a third capacitor connected between said gate of said yet still further MIS transistor and a ground.

28. A semiconductor device comprising:
 first and third MIS transistors of a same conductive type, said first and third MIS transistors having respective first data terminals to which a high potential Vdd is applied;
 second and fourth MIS transistors of the same conductive type as said first and third MIS transistors, said second and fourth MIS transistors having respective first data terminals to which a low potential GND lower than said high potential Vdd is applied;

a first output terminal coupled to second data terminals of said first and second MIS transistors for outputting a first signal;

a second output terminal coupled to second data terminals of said third and fourth MIS transistors for outputting a second signal having a reverse polarity to said first signal output by said first output terminal;

a first input terminal coupled to gates of said first and fourth MIS transistors for supplying a non-inverted signal;

a second input terminal coupled to gates of said second and third MIS transistors for supplying an inverted signal, said inverted signal having a reverse polarity to said non-inverted signal and being synchronized with said non-inverted signal;

a first output voltage compensating circuit arranged among said first data terminals of said first and second MIS transistors and said second input terminal, and a second output voltage compensating circuit arranged among said first data terminals of said third and fourth MIS transistors and said first input terminal.

29. The semiconductor device according to claim 28, wherein said first output voltage compensating circuit comprises (i) a fifth MIS transistor of the same conductive type as said first, second, third and fourth MIS transistors, said fifth MIS transistor including a first data terminal which is connected to said first input terminal, and (ii) a first capacitor connected to a second data terminal of said fifth MIS transistor and said second data terminals of said first and second MIS transistors, wherein said second output voltage compensating circuit comprises (i) a sixth MIS transistor of the same conductive type as said first, second, third, and fourth MIS transistors, said sixth MIS transistor including a first data terminal which is connected to said second input terminal, and (ii) a second capacitor connected to a second data terminal of said sixth MIS transistor and said second data terminals of said third and fourth MIS transistors, and wherein said fifth and sixth MIS transistors have respective gates which are supplied with the high potential Vdd which is applied to said first data terminal of said first and third MIS transistors.

30. The semiconductor device according to claim 29, wherein said first, second, third and fourth MIS transistors are N type.

31. The semiconductor device according to claim 30, wherein said first data terminal of said first MIS transistor is connected to said second input terminal.

32. The semiconductor device according to claim 30, wherein said first data terminal of said third MIS transistor is connected to said second input terminal.

33. The semiconductor device according to claim 30, wherein said first data terminal of said second MIS transistor is connected to said first input terminal.

34. The semiconductor device according to claim 30, wherein said first data terminal of said fourth MIS transistor is connected to said second input terminal.

35. The semiconductor device-according to claim 30, further comprising:

an additional MIS transistor of the same conductive type as said first, second, third and fourth MIS transistors, said additional MIS transistor being connected between said first input terminal and said first output terminal; and a further MIS transistor of the same conductive type as said first, second, third and fourth MIS transistors, said further MIS transistor being connected between said second input terminal and said second output terminal.

36. The semiconductor device according to claim 30, further comprising a logic circuit which includes a plurality of still further MIS transistors of the same conductive type as said first, second, third and fourth MIS transistors.

37. The semiconductor device according to claim 36, wherein said logic circuit includes one of an AND circuit and a NAND circuit.

38. A display driver comprising a plurality of latch circuits formed on an insulating substrate, wherein each of said latch circuits includes:

a first MIS thin film transistor of a conductive type, said first MIS thin film transistor having a first data terminal which receives a high potential Vdd;

a second MIS thin film transistor of the same conductive type as said first, MIS transistor, said second MIS thin film transistor having a first data terminal which receives a low potential GND lower than said high potential Vdd;

an output terminal coupled to second data terminals of said first and second MIS thin film transistors;

a first input terminal connected to a gate of said first MIS thin film transistor for supplying a non-inverted signal;

a second input terminal directly connected to a gate of one of said first and second MIS thin film transistors for supplying an inverted signal, said inverted signal having a reverse polarity to said non-inverted signal and being synchronized with said non-inverted signal; and an output voltage compensating circuit connected between one of (i) said output terminal and said first input terminal and (ii) said output terminal and said second input terminal, wherein said output voltage compensating circuit includes a third MIS thin film transistor of the same conductive type as said first and second MIS thin film transistors, and a capacitor arranged between said third MIS thin film transistor and said output terminal, and wherein said third MIS thin film transistor has a gate which is supplied with one of the high potential Vdd received by said first data terminal of said first thin film MIS transistor and the low potential GND received by said first data terminal of said second MIS thin film transistor.

39. A display driver comprising a plurality of invertor circuits cascaded and formed on an insulating substrate, wherein each of said invertor circuits includes:

first and third MIS thin film transistors of a same conductive type, said first and third MIS thin film transistors having respective first data terminals to which a high potential Vdd is applied;

second and fourth MIS thin film transistors of the same conductive type as said first and third MIS thin film transistors, said second and fourth MIS thin film transistors having respective first data terminals to which a low potential GND lower than said high potential Vdd is applied;

a first output terminal coupled to second data terminals of said first and second MIS thin film transistors for outputting a first signal;

a second output terminal coupled to second data terminals of said third and fourth MIS thin film transistors for outputting a second signal having a reverse polarity to said first signal output by said first output terminal;

a first input terminal coupled to gates of said first and fourth MIS thin film transistors for supplying a non-inverted signal;

a second input terminal coupled to gates of said second and third MIS thin film transistors for supplying an inverted signal, said inverted signal having a reverse polarity to said non-inverted signal and being synchronized with said non-inverted signal;

a first output voltage compensating circuit arranged among said second data terminals of said first and second MIS thin film transistors and said second input terminal, and a second output voltage compensating circuit arranged among said second data terminals of said third and fourth MIS thin film transistors and said first input terminal.

40. A display driver comprising a plurality of invertor circuits cascaded and formed on an insulating substrate, wherein each of said invertor circuits includes:

first and third MIS thin film transistors of a same conductive type, said first and third MIS thin film transistors having respective first data terminals to which a high potential Vdd is applied;

second and fourth MIS thin film transistors of the same conductive type as said first and third MIS thin film transistors, said second and fourth MIS thin film transistors having respective first data terminals to which a low potential GND lower than said high potential Vdd is applied;

a first output terminal coupled to second data terminals of said first and second MIS thin film transistors for outputting a first signal;

a second output terminal coupled to second data terminals of said third and fourth MIS thin film transistors for outputting a second signal having a reverse polarity to said first signal output by said first output terminal;

a first input terminal coupled to gates of said first and fourth MIS thin film transistors for supplying a non-inverted signal;

a second input terminal coupled to gates of said second and third MIS thin film transistors for supplying an inverted signal, said inverted signal having a reverse polarity to said non-inverted signal and being synchronized with said non-inverted signal;

a first output voltage compensating circuit arranged among said second data terminals of said first and second MIS thin film transistors and said first input terminal, and a second output voltage compensating circuit arranged among said second data terminals of said third and fourth MIS thin film transistors and said second input terminal.

* * * * *